United States Patent
Parekh et al.

(10) Patent No.: US 7,151,291 B2
(45) Date of Patent: Dec. 19, 2006

(54) CAPACITOR STRUCTURES, DRAM CELL STRUCTURES, AND INTEGRATED CIRCUITRY, AND METHODS OF FORMING CAPACITOR STRUCTURES, INTEGRATED CIRCUITRY AND DRAM CELL STRUCTURES

(75) Inventors: Kunal R. Parekh, Boise, ID (US); John K. Zahurak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/074,107

(22) Filed: Mar. 7, 2005

(65) Prior Publication Data

US 2005/0173745 A1  Aug. 11, 2005

Related U.S. Application Data

(63) Continuation of application No. 10/310,723, filed on Dec. 4, 2002, now Pat. No. 6,864,138, which is a continuation of application No. 09/767,480, filed on Jan. 22, 2001, now Pat. No. 6,500,709, which is a continuation of application No. 08/798,242, filed on Feb. 11, 1997, now Pat. No. 6,238,971.

(51) Int. Cl.
*H01L 27/108* (2006.01)

(52) U.S. Cl. ............... 257/308; 257/309; 257/311; 257/E27.087

(58) Field of Classification Search ........ 257/307–309, 257/311, E27.087; 438/254–255, 397–398, 438/964
See application file for complete search history.

(56) References Cited

U.S. PATENT DOCUMENTS

| | | |
|---|---|---|
| 4,845,537 A | 7/1989 | Nishimura et al. |
| 4,864,374 A | 9/1989 | Banerjee |
| 5,049,517 A | 9/1991 | Liu et al. |
| 5,155,057 A * | 10/1992 | Dennison et al. ........... 438/254 |
| 5,170,233 A | 12/1992 | Liu et al. |
| 5,206,183 A | 4/1993 | Dennison |
| 5,227,325 A | 7/1993 | Gonzalez |
| 5,229,310 A | 7/1993 | Sivan |

(Continued)

OTHER PUBLICATIONS

Sakao, M., "A Capacitor-Over-Bit-Line (COB) Cell With A Hemispherical-Grain Storage Node For 64Mb DRAMs", 1990 IEEE, pp. 27.3.1-27.3.4.

(Continued)

*Primary Examiner*—M. Wilczewski
*Assistant Examiner*—Toniae M Thomas
(74) *Attorney, Agent, or Firm*—Wells St. John, P.S.

(57) ABSTRACT

The invention encompasses DRAM constructions, capacitor constructions, integrated circuitry, and methods of forming DRAM constructions, integrated circuitry and capacitor constructions. The invention encompasses a method of forming a capacitor wherein: a) a first layer is formed; b) a semiconductive material masking layer is formed over the first layer; c) an opening is etched through the masking layer and first layer to a node; d) a storage node layer is formed within the opening and in electrical connection with the masking layer; e) a capacitor storage node is formed from the masking layer and the storage node layer; and f) a capacitor dielectric layer and outer capacitor plate are formed operatively proximate the capacitor storage node.

4 Claims, 24 Drawing Sheets

U.S. PATENT DOCUMENTS

| | | | |
|---|---|---|---|
| 5,229,326 A | 7/1993 | Dennison et al. | |
| 5,244,826 A | 9/1993 | Gonzalez et al. | |
| 5,270,968 A | 12/1993 | Kim et al. | |
| 5,283,455 A | 2/1994 | Inoue et al. | |
| 5,286,668 A * | 2/1994 | Chou | 438/254 |
| 5,294,561 A | 3/1994 | Tanigawa | |
| 5,318,927 A | 6/1994 | Sandhu et al. | |
| 5,323,038 A | 6/1994 | Gonzalez et al. | |
| 5,334,862 A | 8/1994 | Manning et al. | |
| 5,338,700 A | 8/1994 | Dennison et al. | |
| 5,354,705 A * | 10/1994 | Mathews et al. | 438/397 |
| 5,371,701 A * | 12/1994 | Lee et al. | 365/149 |
| 5,385,858 A | 1/1995 | Manabe | |
| 5,387,531 A * | 2/1995 | Rha et al. | 438/397 |
| 5,389,560 A | 2/1995 | Park | |
| 5,391,511 A | 2/1995 | Doan et al. | |
| 5,401,681 A | 3/1995 | Dennison | |
| 5,438,011 A | 8/1995 | Blalock et al. | |
| 5,444,013 A | 8/1995 | Akram et al. | |
| 5,447,878 A | 9/1995 | Park et al. | |
| 5,468,670 A | 11/1995 | Ryou | |
| 5,478,768 A | 12/1995 | Iwasa | |
| 5,482,886 A | 1/1996 | Park et al. | |
| 5,492,848 A | 2/1996 | Lur et al. | |
| 5,492,850 A | 2/1996 | Ryou | |
| 5,516,719 A | 5/1996 | Ryou | |
| 5,550,080 A | 8/1996 | Kim | |
| 5,554,557 A | 9/1996 | Koh | |
| 5,563,089 A | 10/1996 | Jost et al. | |
| 5,567,640 A | 10/1996 | Tseng | |
| 5,595,929 A * | 1/1997 | Tseng | 438/397 |
| 5,604,147 A | 2/1997 | Fischer et al. | |
| 5,605,857 A | 2/1997 | Jost et al. | |
| 5,650,351 A | 7/1997 | Wu | |
| 5,661,064 A | 8/1997 | Figura et al. | |
| 5,766,995 A * | 6/1998 | Wu | 438/255 |
| 5,786,249 A | 7/1998 | Dennison | |
| 5,851,898 A | 12/1998 | Hsia et al. | |
| 5,909,616 A | 6/1999 | Dennison | |
| 5,918,122 A | 6/1999 | Parekh et al. | |
| 5,953,609 A | 9/1999 | Koyama et al. | |
| 5,981,333 A | 11/1999 | Parekh et al. | |
| 5,986,300 A * | 11/1999 | Tanaka | 257/306 |
| 6,027,967 A | 2/2000 | Parekh et al. | |
| 6,037,624 A * | 3/2000 | King | 257/309 |
| 6,060,352 A | 5/2000 | Sekiguchi et al. | |
| 6,066,541 A | 5/2000 | Hsieh et al. | |
| 6,083,831 A | 7/2000 | Dennison | |
| 6,090,663 A | 7/2000 | Wu | |
| 6,218,237 B1 | 4/2001 | Sandhu et al. | |
| 6,228,738 B1 * | 5/2001 | Parekh et al. | 438/398 |
| 6,251,725 B1 | 6/2001 | Chiou et al. | |
| 6,359,302 B1 | 3/2002 | Parekh et al. | |
| 6,376,301 B1 | 4/2002 | Parekh et al. | |
| 6,410,423 B1 | 6/2002 | Anezaki et al. | |

OTHER PUBLICATIONS

Aoki, M., et al., "Fully Self-Aligned 6F$^2$ Cell Technology For Low Cost 1Gb DRAM", 1996 IEEE, pp. 22-23.

IBM Technical Disclosure Bulletin, "Methods of Forming Small Contact Holes", vol. 30, No. 8 (Jan. 1988), pp. 252-253.

Hayden, J.D., et al., "A New Toroidal TFT Structure For Future Generation SRAMs", IEEE 1993, pp. 825-828, IEDM.

* cited by examiner

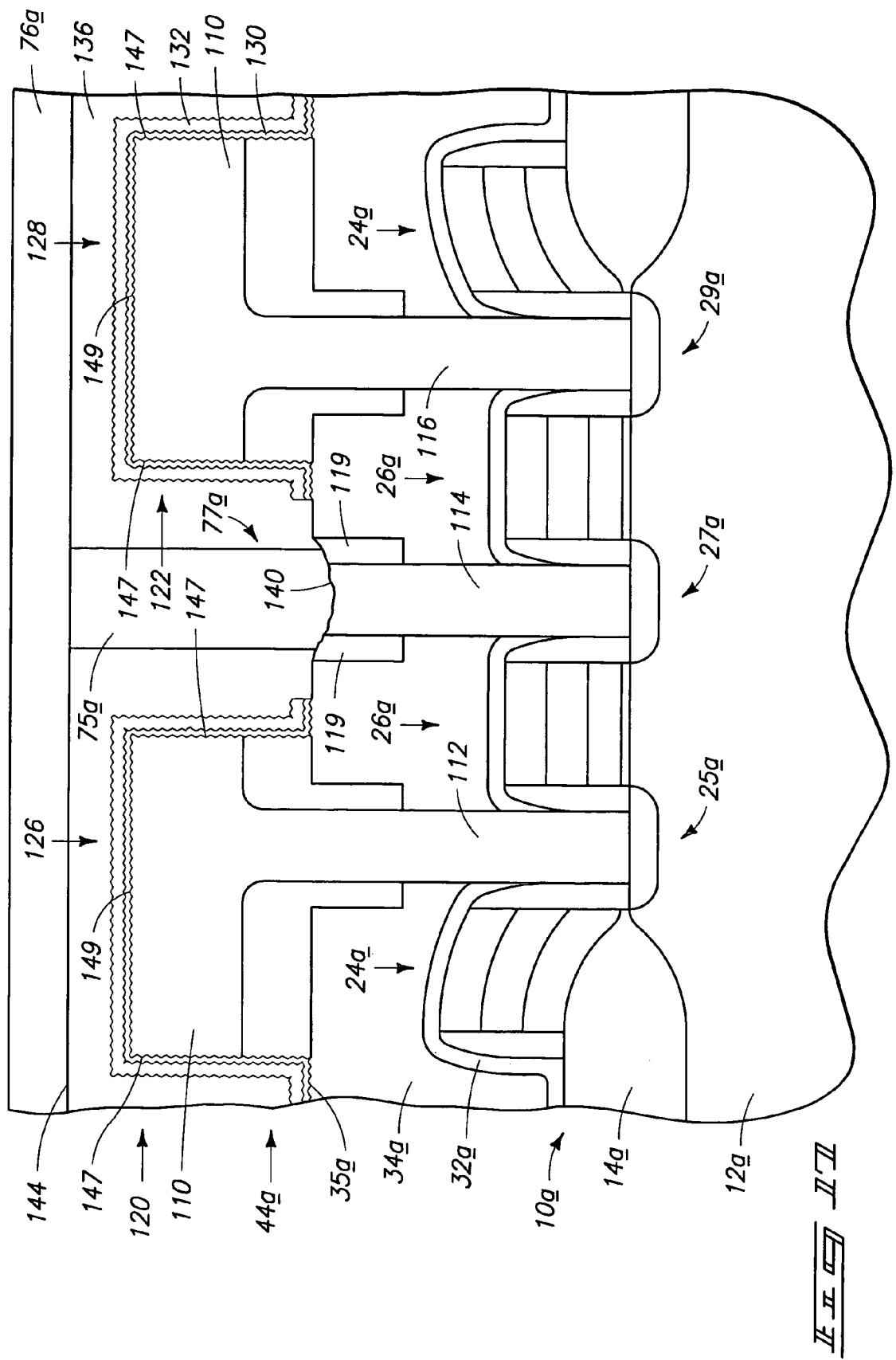

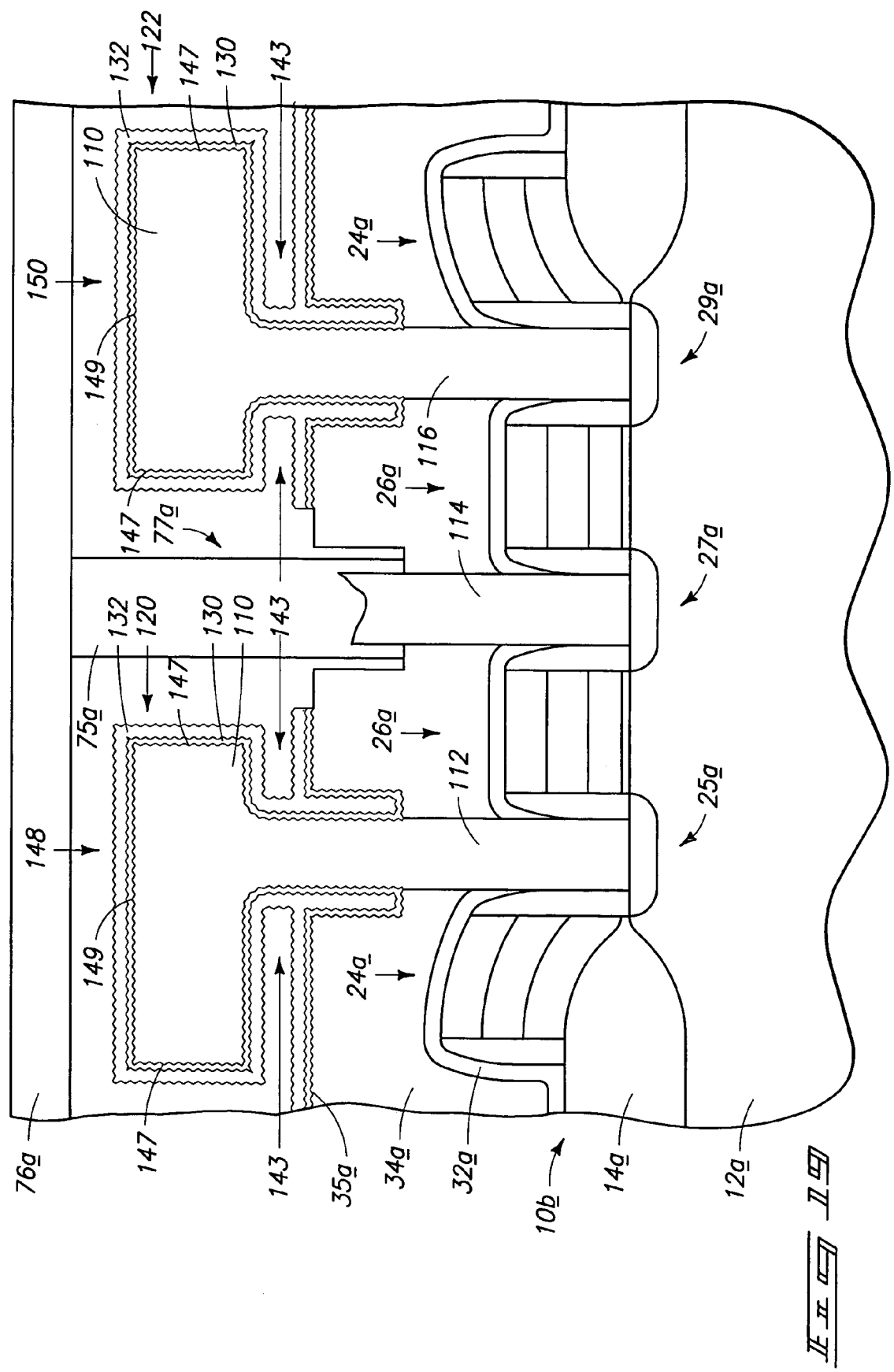

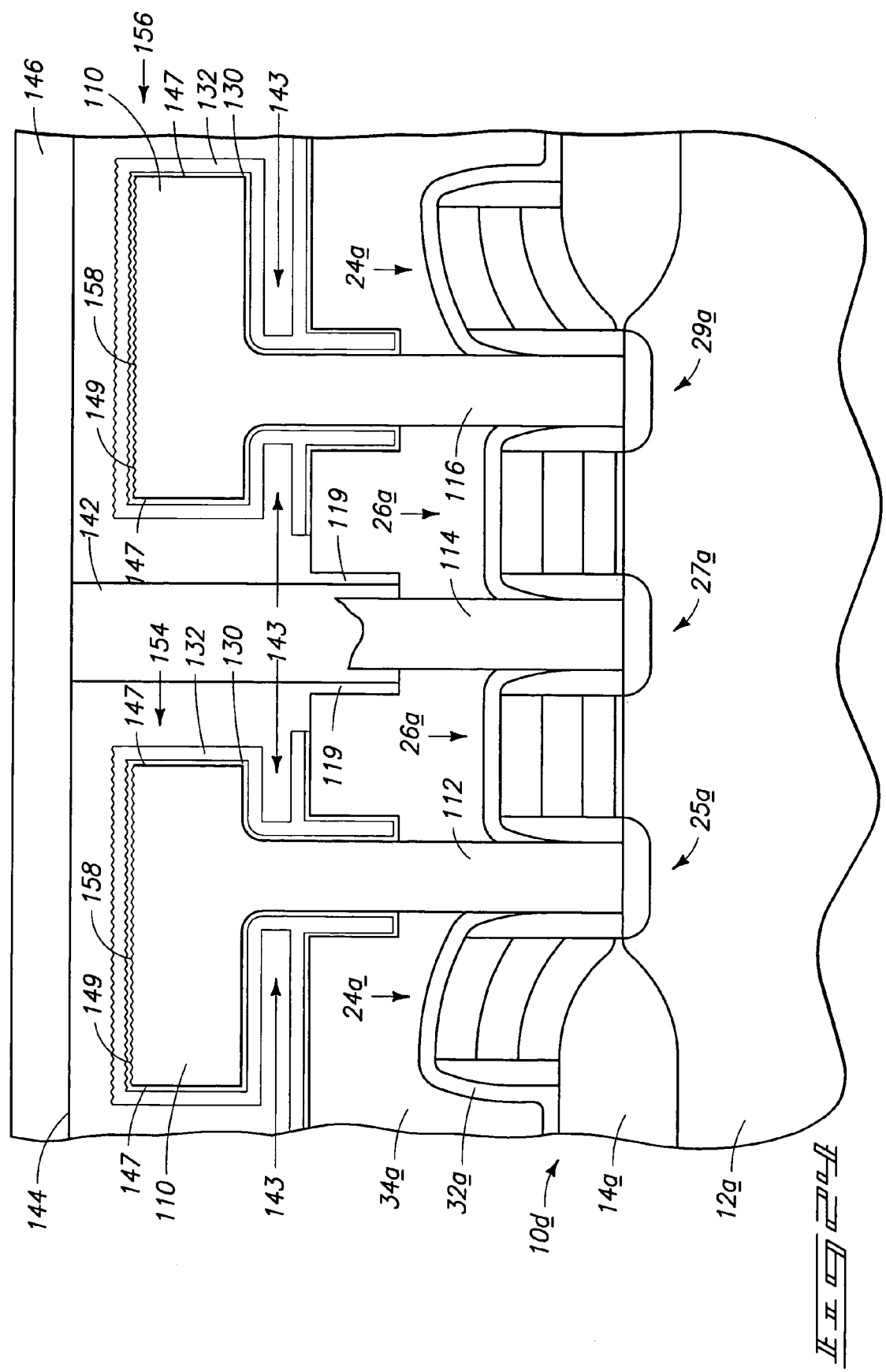

CAPACITOR STRUCTURES, DRAM CELL STRUCTURES, AND INTEGRATED CIRCUITRY, AND METHODS OF FORMING CAPACITOR STRUCTURES, INTEGRATED CIRCUITRY AND DRAM CELL STRUCTURES

CROSS REFERENCE TO RELATED APPLICATION

This patent application is a Continuation Application of U.S. patent application Ser. No. 10/310,723, filed Dec. 4, 2002, now U.S. Pat. No. 6,864,138, entitled "Capacitor Structures, DRAM Cell Structures, and Integrated Circuitry, and Methods of Forming Capacitor Structures, Integrated Circuitry and DRAM Cell Structures," naming Kunal R. Parekh and John K. Zahurak as inventors, which is a Continuation of U.S. patent application Ser. No. 09/767,480, filed Jan. 22, 2001, now U.S. Pat. No. 6,500,709 B2, which is a continuation of U.S. patent application Ser. No. 08/798,242, filed Feb. 11, 1997, now U.S. Pat. No. 6,238,971 B1, the disclosures of which are hereby incorporated herein by reference.

TECHNICAL FIELD

This invention pertains to semiconductor capacitor constructions and to methods of forming semiconductor capacitor constructions. The invention is thought to have particular significance in application to methods of forming dynamic random access memory (DRAM) cell structures, and to DRAM cell structures.

BACKGROUND OF THE INVENTION

A commonly used semiconductor memory device is a DRAM cell. A DRAM cell generally consists of a capacitor coupled through a transistor to a bitline. A continuous challenge in the semiconductor industry is to increase DRAM circuit density. Accordingly, there is a continuous effort to decrease the size of memory cell components. A limitation on the minimal size of cell components is impacted by the resolution of a photolithographic etch during a fabrication process. Although this resolution is generally being improved, at any given time there is a minimum photolithographic feature dimension of which a fabrication process is capable. It would be desirable to form DRAM components having at least some portions which comprise a cross-sectional dimension of less than a given minimum capable photolithographic feature dimension.

Another continuous trend in the semiconductor industry is to minimize processing steps. Accordingly, it is desirable to utilize common steps for the formation of separate DRAM components. For instance, it is desirable to utilize common steps for the formation of the DRAM capacitor structures and the DRAM bitline contacts.

A semiconductor wafer fragment 10 is illustrated in FIG. 1 showing a prior art DRAM array 83. Wafer fragment 10 comprises a semiconductive material 12, field oxide regions 14, and wordlines 24 and 26. Wordlines 24 and 26 comprise a gate oxide layer 16, a polysilicon layer 18, a silicide layer 20 and a silicon oxide layer 22. Silicide layer 20 comprises a refractory metal silicide, such as tungsten silicide, and polysilicon layer 18 typically comprises polysilicon doped with a conductivity enhancing dopant. Nitride spacers 30 are laterally adjacent wordlines 24 and 26.

Electrical node locations 25, 27 and 29 are between wordlines 24 and 26 and are electrically connected by transistor gates comprised by wordlines 24 and 26. Node locations 25, 27 and 29 are diffusion regions formed within semiconductive material 12.

A borophbsphosilicate glass (BPSG) layer 34 is over semiconductive material 12 and wordlines 24 and 26. An oxide layer 32 is provided between BPSG layer 34 and material 12. Oxide layer 32 inhibits diffusion of phosphorus from BPSG layer 34 into underlying materials.

Conductive pedestals 54, 55 and 56 extend through BPSG layer 34 to node locations 25, 27 and 29, respectively. Capacitor constructions 62 and 64 contact upper surfaces of pedestals 54 and 56, respectively. Capacitor constructions 62 and 64 comprise a storage node layer 66, a dielectric layer 68, and a cell plate layer 70. Dielectric layer 68 comprises an electrically insulative layer, such as silicon nitride. Cell plate layer 70 comprises conductively doped polysilicon, and may 4 alternatively be referred to as a cell layer 70. Storage node layer 66 comprises conductively doped hemispherical grain polysilicon.

A conductive bitline plug 75 contacts an upper surface of pedestal 55. Bitline plug 75 may comprise, for example, tungsten. Together, bitline plug 75 and pedestal 55 comprise a bitline contact 77.

A bitline 76 extends over capacitors 62 and 64 and in electrical connection with bitline contact 77. Bitline 76 may comprise, for example, aluminum.

The capacitors 62 and 64 are electrically connected to bitline contact 77 through transistor gates comprised by wordlines 26. A first DRAM cell 79 comprises capacitor 62 electrically connected to bitline 76 through a wordline 26 and bitline contact 77. A second DRAM cell 81 comprises capacitor 64 electrically connected to bitline 76 through wordline a 26 and bitline contact 77. DRAM array 83 comprises first and second DRAM cells 79 and 81.

SUMMARY OF THE INVENTION

The invention includes a number of methods and structures pertaining to semiconductor circuit technology, including: methods of forming DRAM memory cell constructions; methods of forming capacitor constructions; methods of forming capacitor and bitline constructions; DRAM memory cell constructions; capacitor constructions; capacitor and bitline constructions, and integrated circuitry.

The invention encompasses a method of forming a capacitor wherein a first layer is formed over a node location and a semiconductive material masking layer is formed over the first layer, wherein an opening is etched through the semiconductive material masking layer and first layer to the node location using the semiconductive material masking layer as an etch mask, wherein a storage node layer is formed within the opening and in electrical connection with the masking layer, and wherein at least the masking layer is patterned to form a capacitor storage node comprising the masking layer and the storage node layer.

The invention also encompasses a method of forming a capacitor wherein a first layer is formed over a node location wherein a semiconductive material masking layer is formed over the first layer, wherein an opening is etched through the semiconductive material masking layer and first layer to the node location using the semiconductive material masking layer as an etch mask, wherein a storage node layer is formed to substantially fill the opening and in electrical connection with the masking layer, and wherein the masking layer and the storage node layer are patterned to form a capacitor storage node.

The invention also encompasses a DRAM cell comprising a capacitor electrically connected to a bitline through a transistor gate, wherein the capacitor comprises a storage node which, in lateral cross-section, has an outer surface extending over its top, along a pair of its opposing lateral surfaces, and within laterally opposing cavities beneath it. The capacitor further comprises a dielectric layer against the storage node outer surface and extending along the lateral opposing surfaces of the storage node and within the opposing cavities beneath the storage node. Additionally, the capacitor comprises a cell plate layer against the dielectric layer and extending along the lateral opposing surfaces of the storage node and within the opposing cavities beneath the storage node.

BRIEF DESCRIPTION OF THE DRAWINGS

Preferred embodiments of the invention are described below with reference to the following accompanying drawings.

FIG. 17 is a view of the FIG. 2 wafer fragment at a processing step subsequent to that of FIG. 16.

FIG. 19 is a view of the FIG. 2 wafer fragment at a processing step subsequent to that of FIG. 18.

FIG. 24 is a view of the FIG. 2 wafer fragment, processed according to a fourth embodiment method of the present invention.

DESCRIPTION OF THE SPECIFIC EMBODIMENTS

This disclosure of the invention is submitted in furtherance of the constitutional purposes of the U.S. Patent Laws "to promote the progress of science and useful arts" (Article 1, Section 8).

Figure 18B:
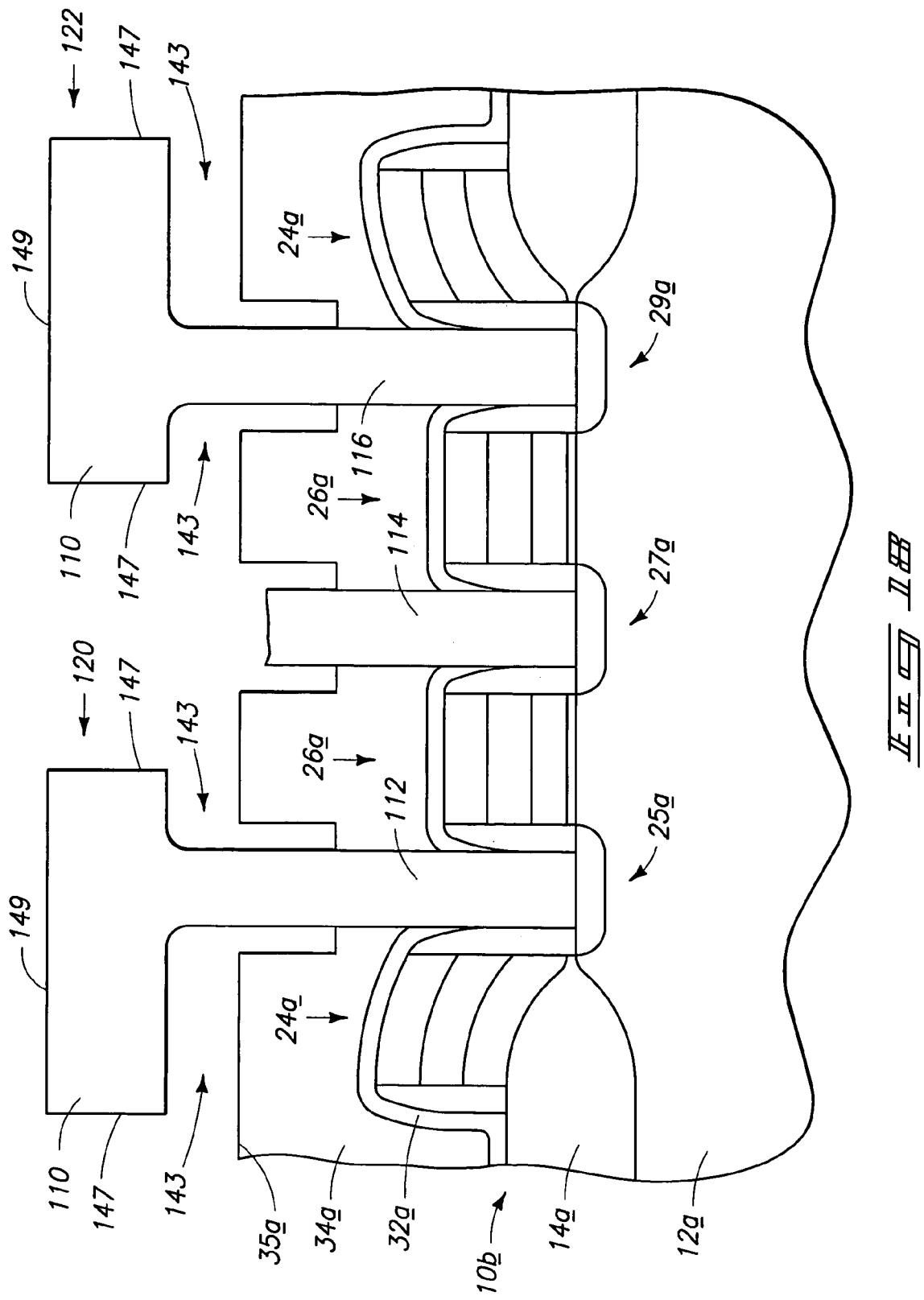
FIG. 18 is a view of the FIG. 2 wafer fragment at a processing step subsequent to that of FIG. 11, processed according to a second embodiment method of the present invention.

A method of forming a DRAM of the present invention is described with reference to FIGS. 2–24, with FIGS. 2–17 pertaining to a first embodiment of the invention; FIGS. 18 and 19 pertaining to a second embodiment of the invention; FIGS. 20–23 pertaining to a third embodiment of the invention; and FIG. 24 pertaining to a fourth embodiment of the invention.

In describing the first embodiment, like numerals from the preceding discussion of the prior art are utilized where appropriate, with differences being indicated by the suffix "a" or with different numerals.

Figure 1:
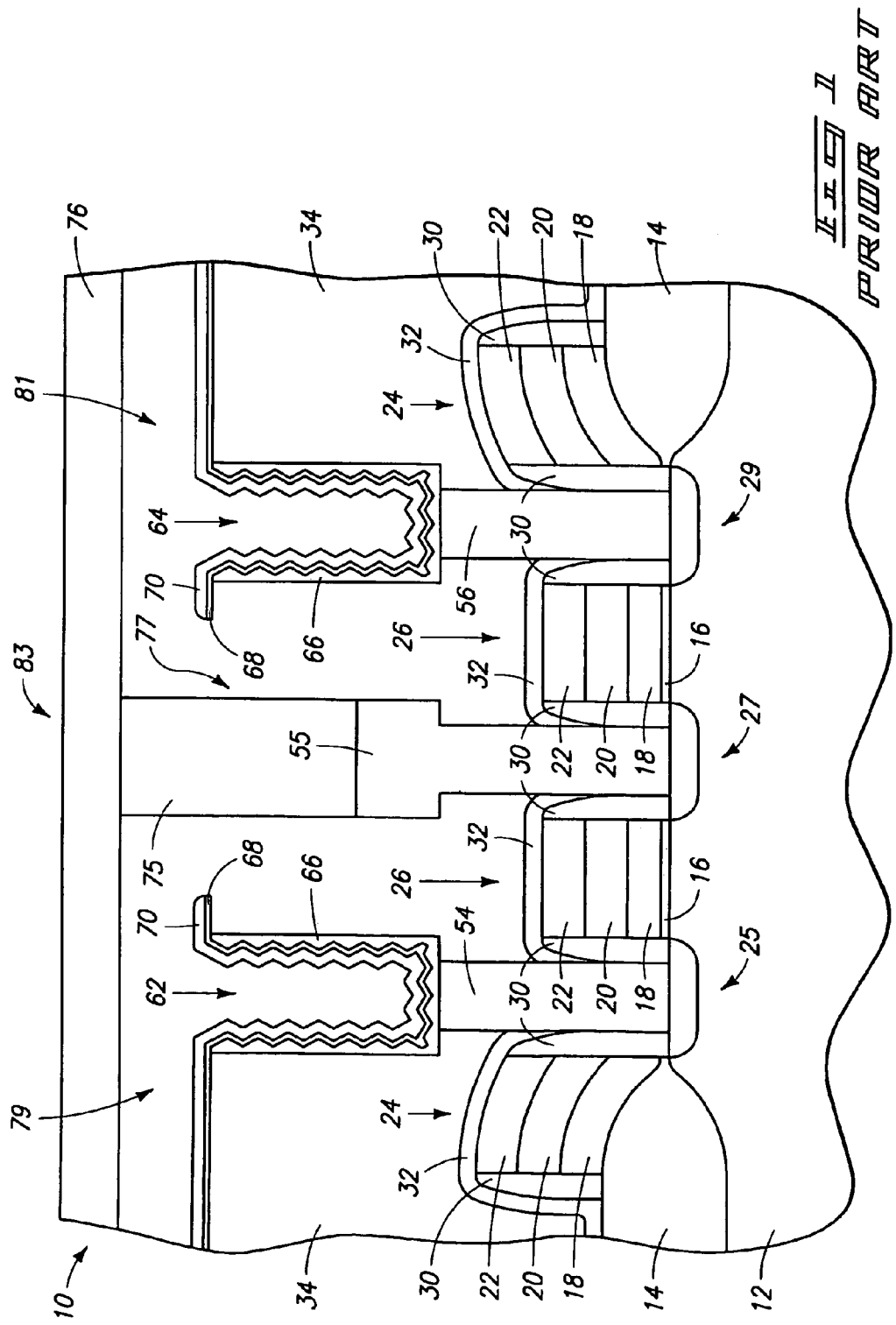
FIG. 1 is a schematic cross-sectional view of a semiconductor wafer fragment comprising a prior art DRAM cell.
Figure 2:
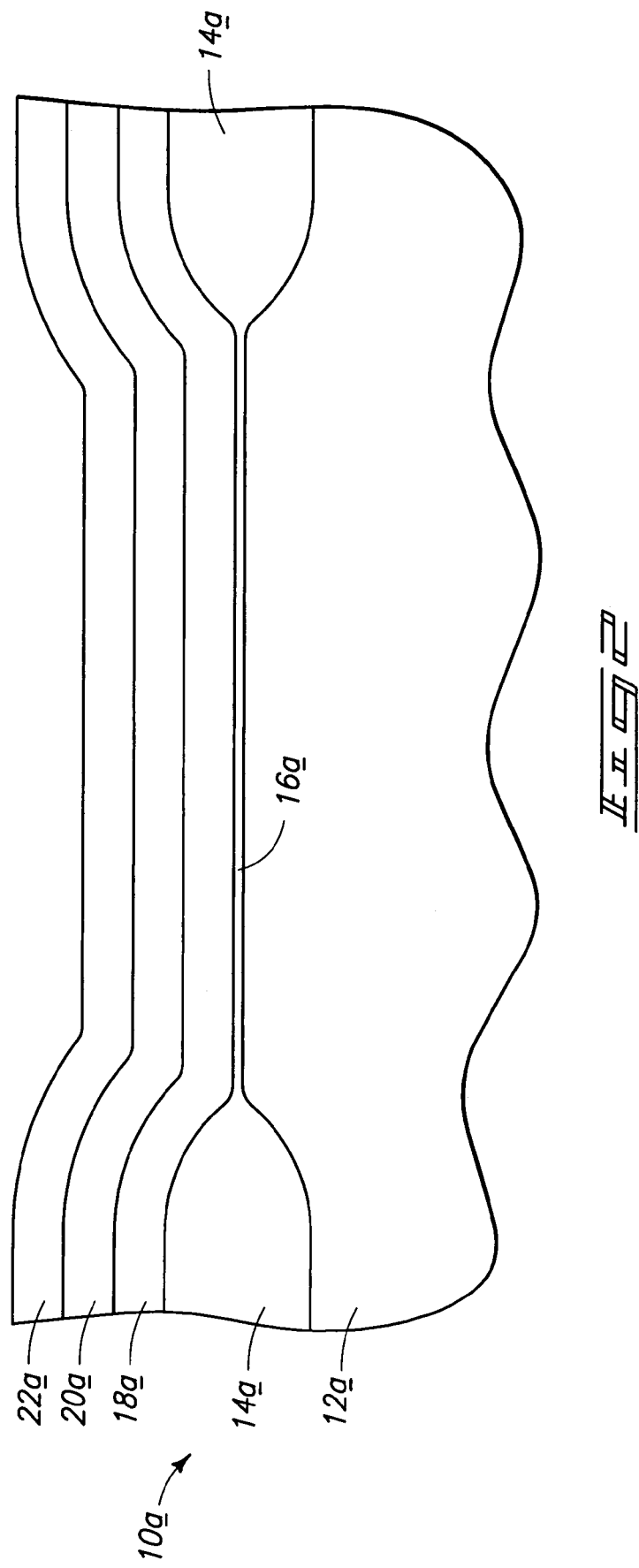
FIG. 2 is a schematic cross-sectional process view of a semiconductor wafer fragment at preliminary processing step of a processing method of the present invention.

Referring to FIG. 2, a semiconductor wafer fragment 10a is illustrated at a preliminary step of a process of the present invention. Wafer fragment 10a comprises a semiconductive material 12a, field oxide regions 14a, and a thin gate oxide layer 16a. Over gate oxide layer 16a is formed polysilicon layer 18a, silicide layer 20a and silicon oxide layer 22a. Silicide layer 20a comprises a refractory metal silicide, such as tungsten silicide, and polysilicon layer 18a typically comprises polysilicon doped with a conductivity enhancing dopant. Layers 16a, 18a, 20a and 22a can be formed by conventional methods.

Figure 3:
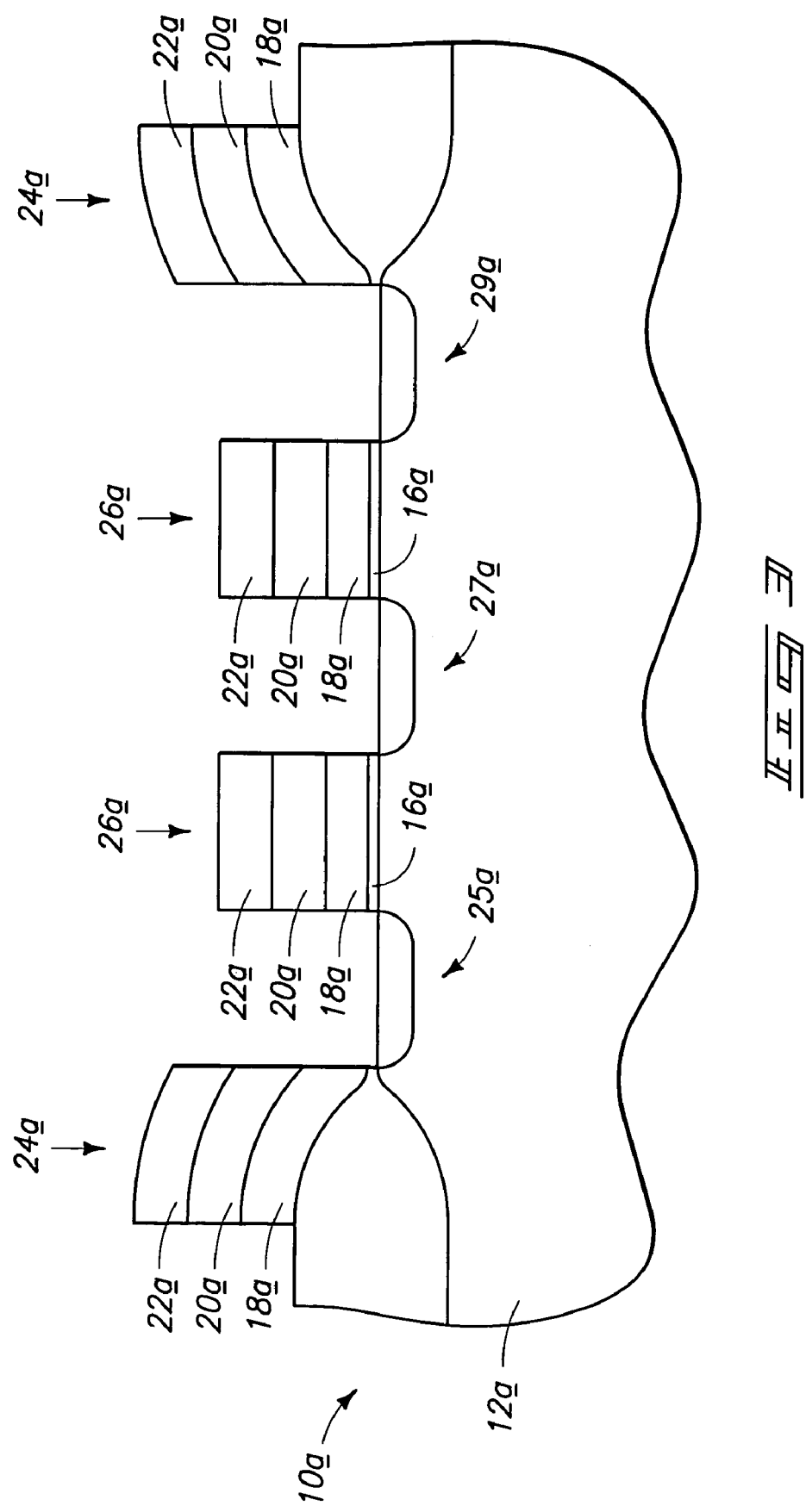
FIG. 3 is a view of the FIG. 2 wafer fragment at a processing step subsequent to that of FIG. 2.

Referring next to FIG. 3, polysilicon layer 18a, silicide layer 20a and silicon oxide layer 22a are etched to form wordlines 24a and 26a. Such etching can be accomplished by conventional methods. Between wordlines 24a and 26a are defined electrical node locations 25a, 27a and 29a, with wordlines 26a comprising transistor gates which electrically connect node locations 25a, 27a, and 29a. Node locations 25a, 27a and 29a are diffusion regions formed within semiconductive material 12a by ion implanting conductivity enhancing dopant into the material 12a. Such ion implanting may occur after patterning wordlines 24a and 26a, a utilizing wordlines 24a and 26a as masks. Alternatively, the diffusion regions may be formed prior to deposition of one or more of layers 18a, 20a and 22a (shown in FIG. 2). In yet other alternative 11 methods, the diffusion regions may be formed after formation of doped polysilicon pedestals (such as the pedestals 112, 114 and 116 shown in FIG. 10, and to be described subsequently) by out-diffusion of conductivity enhancing dopant from the pedestals.

For the above-discussed reasons, defined electrical node locations 25a, 27a, and 29a need not be electrically conductive at the preliminary step of FIG. 3. Node locations 25a, 27a and 29a can be conductive at the step of FIG. 3 if formed by ion implanting of dopant into semiconductive material 12a. On the other hand, node locations 25a, 27a and 29a can be substantially non-conductive at the preliminary step of FIG. 3 in, for example, embodiments in which node locations 25a, 27a and 29a are ultimately doped by out-diffusion of dopant from conductively doped pedestals, such as the pedestals 112, 114 and 116 of FIG. 10.

Figure 4:
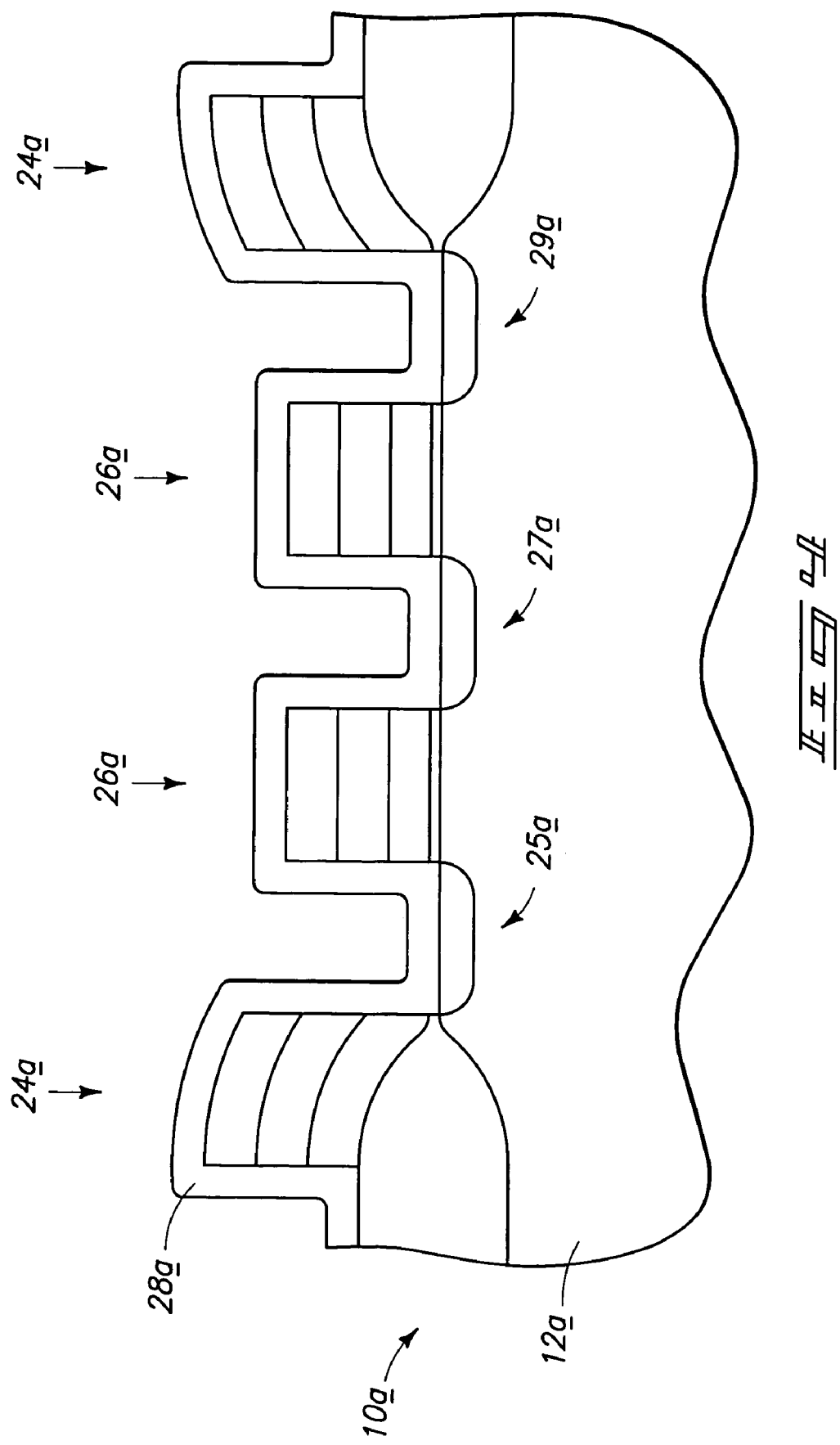
FIG. 4 is a view of the FIG. 2 wafer fragment at a processing step subsequent to that of FIG. 3.
Figure 5:
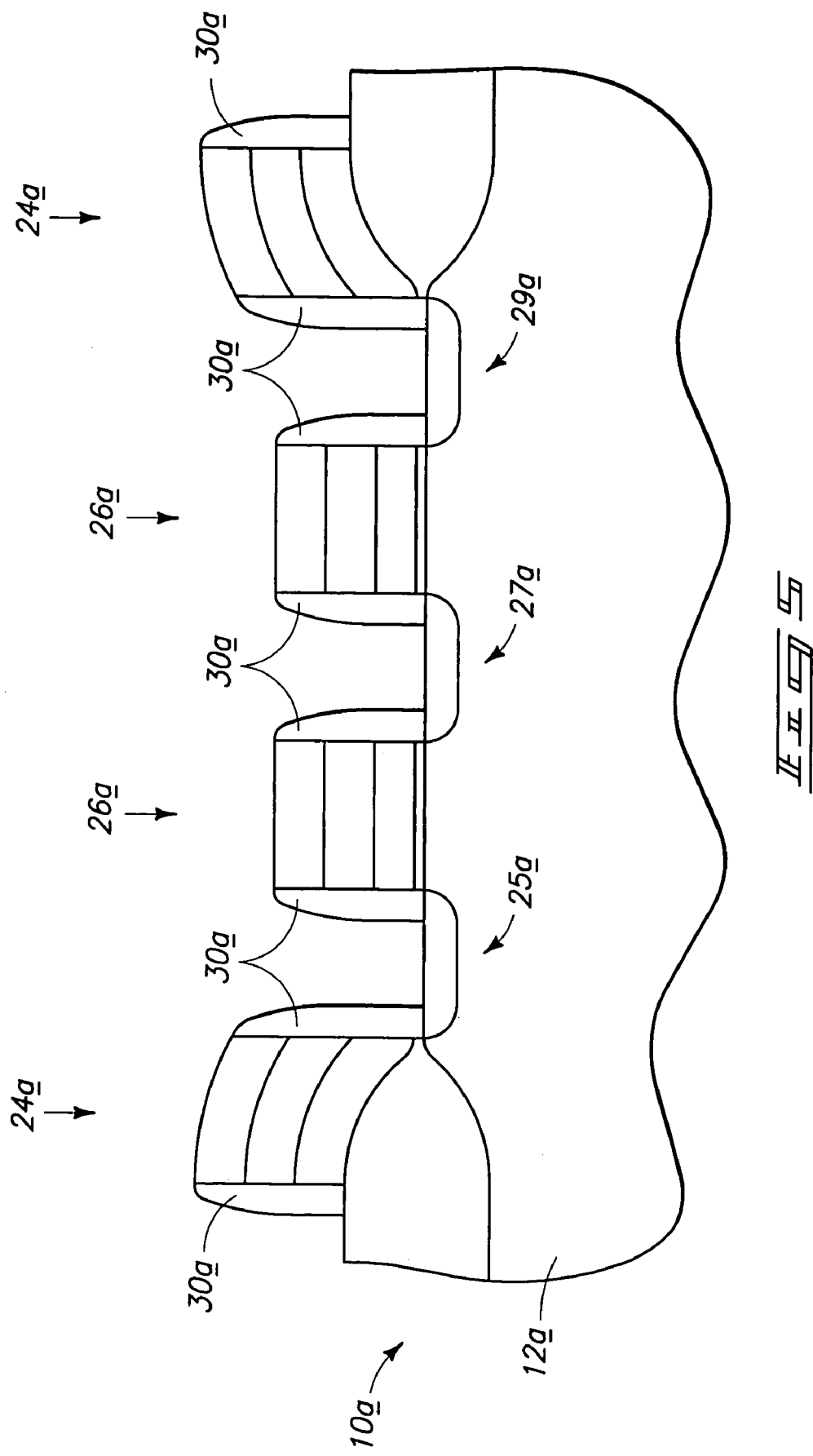
FIG. 5. is a view of the FIG. 2 wafer fragment at a processing step subsequent to that of FIG. 4.

Referring to FIGS. 4 and 5, a nitride layer 28a is provided over wordlines 24a and 26a and subsequently etched to form nitride spacers 30a laterally adjacent wordlines 24a and 26a.

Figure 6:
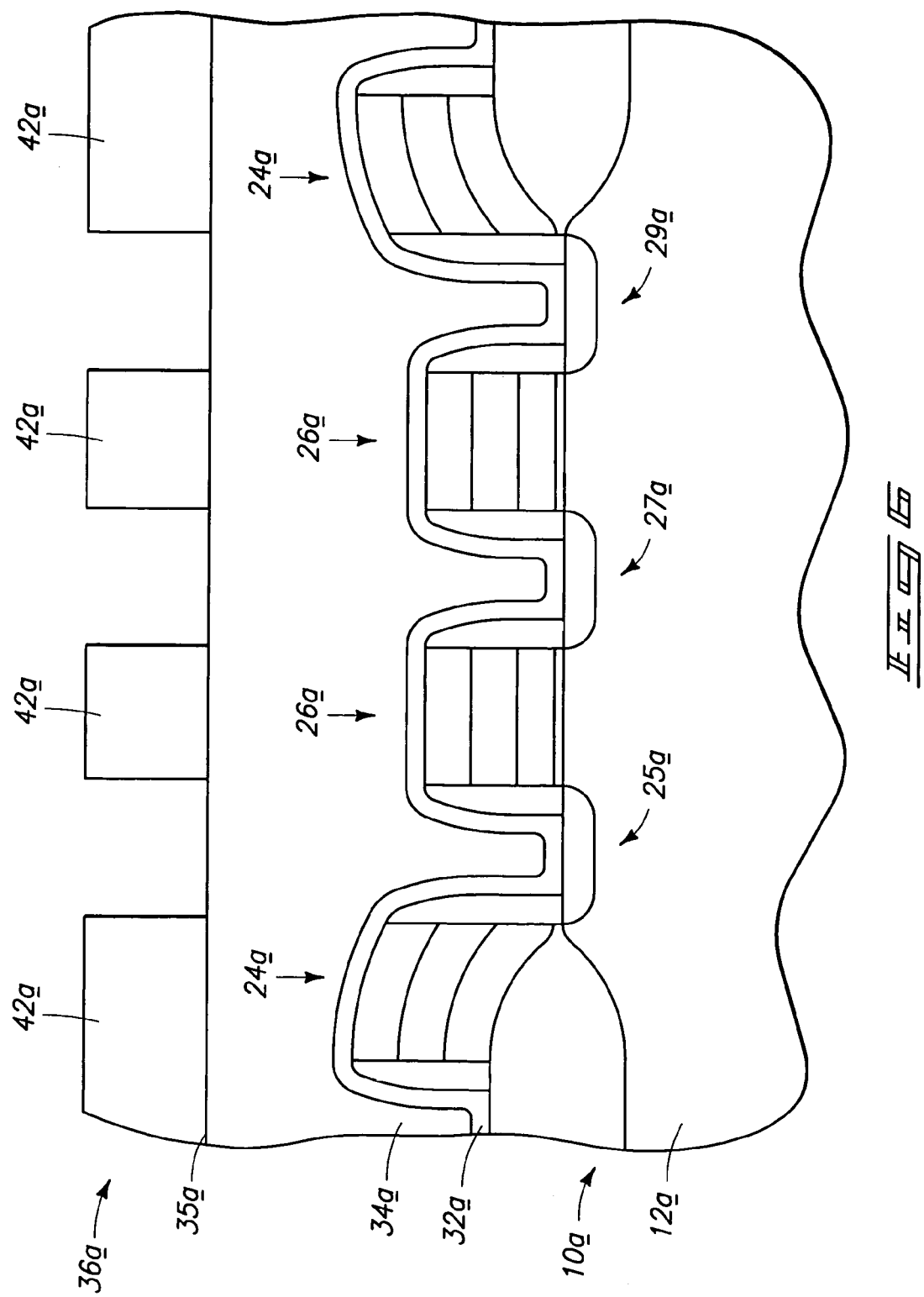
FIG. 6 is a view of the FIG. 2 wafer fragment at a processing step subsequent to that of FIG. 5.

Referring to FIG. 6, an overlying oxide layer 32a is provided over wordlines 24a and 26a, and a BPSG layer 34a is provided over oxide layer 32a. Oxide layer 32a functions to prevent the diffusion of phosphorus from the BPSG into underlying materials. Overlying oxide layer 32a is about 500 Angstroms thick, and BPSG layer 34a is about 14,000 Angstroms thick. BPSG layer 34a is planarized, for example, by chemical-mechanical polishing. Such planarization forms a planar upper surface 35a.

After the planarization of layer 34a, a patterned polysilicon masking layer 36a is provided over layer 34a. Patterned polysilicon layer 36a is preferably undoped and about 3000 Angstroms thick. Formation of patterned polysilicon layer 36a can comprise provision of a patterned photoresist layer over an unpatterned polysilicon layer, followed by a conventional etch of the polysilicon to transfer a pattern from the patterned photoresist layer to the polysilicon, and thereby form patterned polysilicon layer 36a. In the shown cross-sectional view, masking layer 36a comprises masking layer segments 42a.

Figure 7:
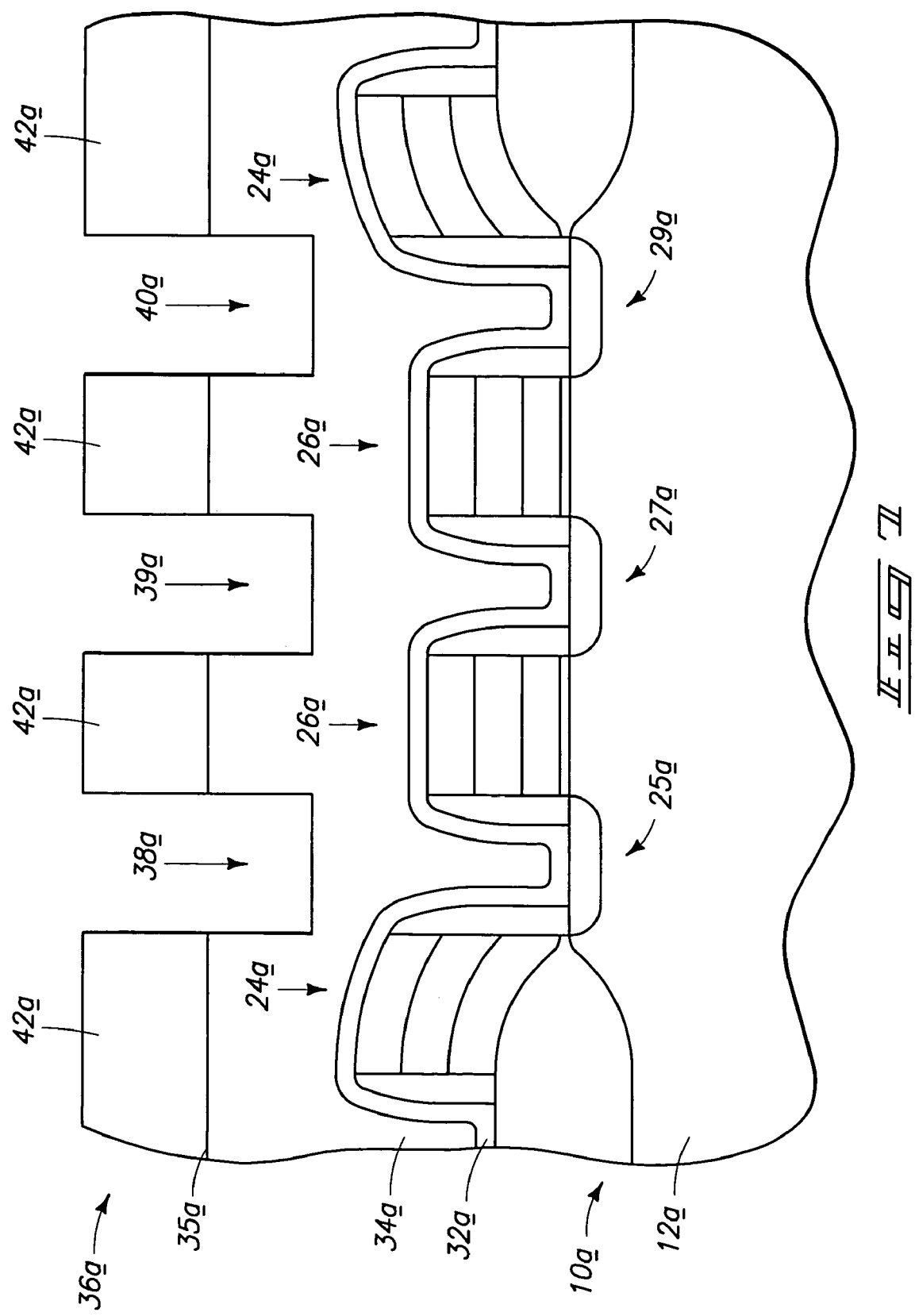
FIG. 7 is a view of the FIG. 2 wafer fragment at a processing step subsequent to that of FIG. 6.

Referring to FIG. 7, openings 38a, 39a and 40a are etched through patterned polysilicon layer 36a and into BPSG layer 34a, typically using a timed anisotropic dry etch.

Figure 8B:
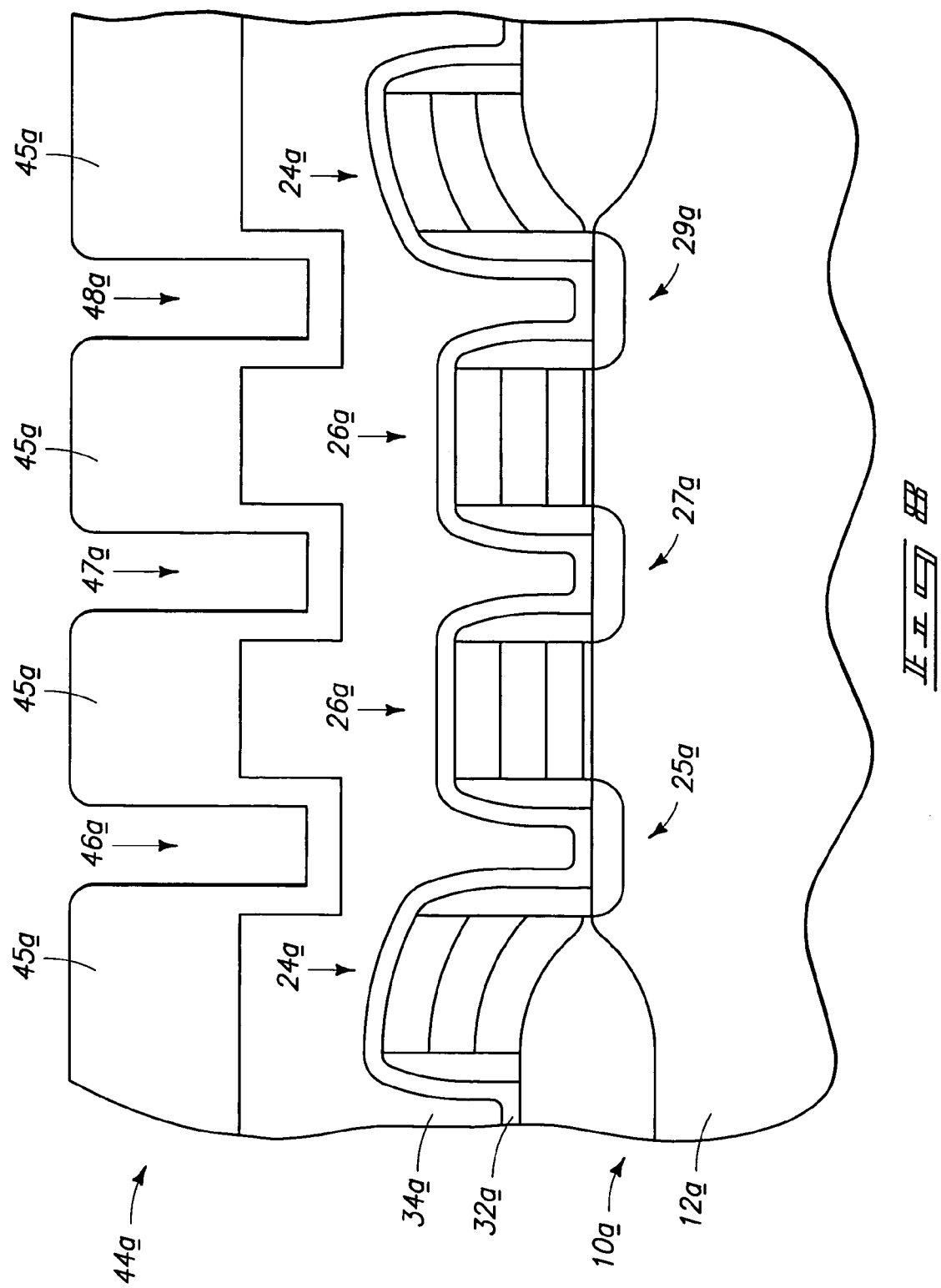
FIG. 8 is a view of the FIG. 2 wafer fragment at a processing step subsequent to that of FIG. 7.

Referring to FIG. 8, a second polysilicon layer is deposited over segments 42a and within openings 38a, 39a and 40a to form a composite polysilicon layer 44a. Typically the second polysilicon layer will be formed to a thickness of 1200 Angstroms. The second polysilicon will preferably have an identical chemical constituency to patterned polysilicon layer 36a (shown in FIGS. 6 and 7) so that combined polysilicon layer 44a has a uniform constituency throughout its width. Accordingly, the second polysilicon layer preferably comprises undoped polysilicon.

Composite polysilicon layer 44a comprises raised portions 45a where the second polysilicon layer overlaps segments 42a (shown in FIGS. 6 and 7) of patterned polysilicon layer 36a (shown in FIGS. 6 and 7). Composite polysilicon layer 44a partially fills openings 38a, 39a and 40a (shown in FIGS. 6 and 7), to form narrowed contact openings 46a, 47a and 48a within the contact openings 38a, 39a and 40a, respectively. If openings 38a, 39a, and 40a are formed to a minimum capable photolithographic feature dimension obtainable during their fabrication, narrowed contact openings 46a, 47a, and 48a will comprise a cross-sectional minimum dimension of less than such minimum capable photolithographic feature dimension.

Figure 9:
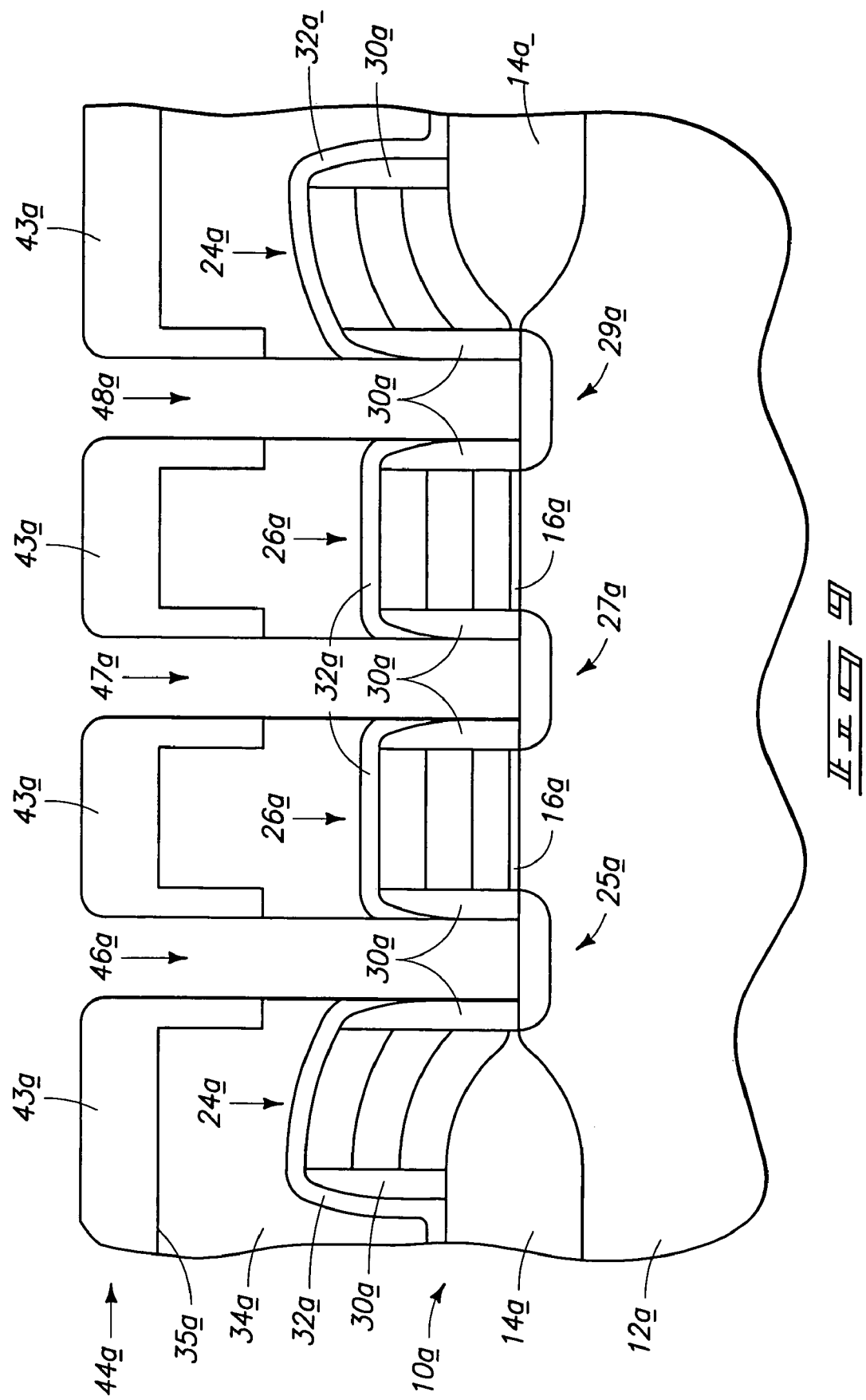
FIG. 9 is a view of the FIG. 2 wafer fragment at a processing step subsequent to that of FIG. 8.

Referring to FIG. 9, raised portions 45a (shown in FIG. 8) are utilized as a masking layer for an in situ contact etch which extends openings 46a, 47a and 48a through BPSG layer 34a and overlying oxide layer 32a to node locations 25a, 27a and 29a. After the extension of openings 46a, 47a and 48a, polysilicon layer 44a is divided into segments 43a remaining adjacent openings 46a, 47a and 48a.

Figure 10:
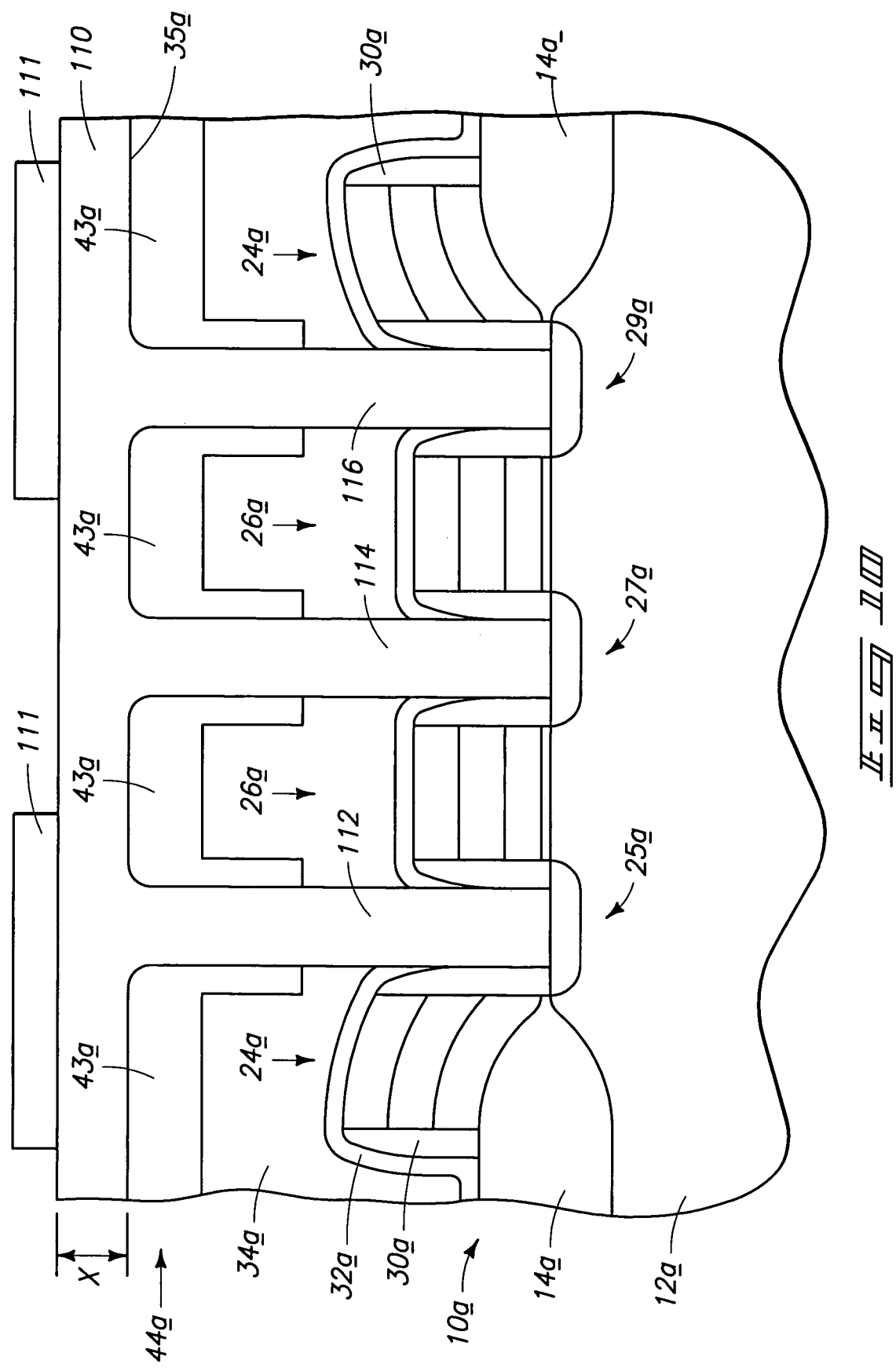
FIG. 10 is a view of the FIG. 2 wafer fragment at a processing step subsequent to that of FIG. 9.

Referring to FIG. 10, a storage node layer 110 is provided over segments 43a and within openings 46a, 47a, and 48a (shown in FIG. 9). Storage node layer 110 generally comprises conductive material, and most preferably comprises in situ doped polysilicon. In applications in which layer 110 comprises in situ doped polysilicon, the layer preferably comprises a thickness "X" of greater than 1000 Angstroms, more preferably of from about 6000 Angstroms to about 16,000 Angstroms, and most preferably of from about 6000 Angstroms to about 10,000 Angstroms. Methods for forming layer 110 are known to persons of ordinary skill in the art. An example method for forming the preferred in situ doped polysilicon layer 110 is a chemical vapor deposition (CVD) process utilizing gaseous phosphine as a dopant source.

The material of layer 110 within openings 46a, 47a and 48a (shown in FIG. 9) forms conductive pedestals 112, 114 and 116 extending to node locations 25a, 27a and 29a, respectively. Storage node layer 110 is preferably in electrical connection with masking layer 44a, and most preferably in physical contact with masking layer 44a.

Photoresist blocks 111 are formed above layer 110. After formation of blocks 111, layers 110 and 44a are etched to form storage nodes 120 and 122 (shown in FIG. 11). Methods for etching the preferred doped polysilicon layer 110 and undoped polysilicon layer 44a to form storage nodes 120 and 122 will be readily recognized by persons of ordinary skill in the art, and include, for example, an anisotropic dry etch. Blocks 111 are removed after formation of storage nodes 120 and 122.

As mentioned previously, layer 44a preferably initially comprises undoped polysilicon. In such preferred circumstances, layer 44a may be conductively doped by out-diffusion of conductivity enhancing dopant from storage node layer 110 to increase the conductive surface area of storage nodes 120 and 122. Alternatively, by way of example, layer 44a may comprise conductively doped polysilicon, in which case the entirety of storage nodes 120 and 122 are conductive without substantial out-diffusion from layer 110 into layer 44a.

Figure 11:
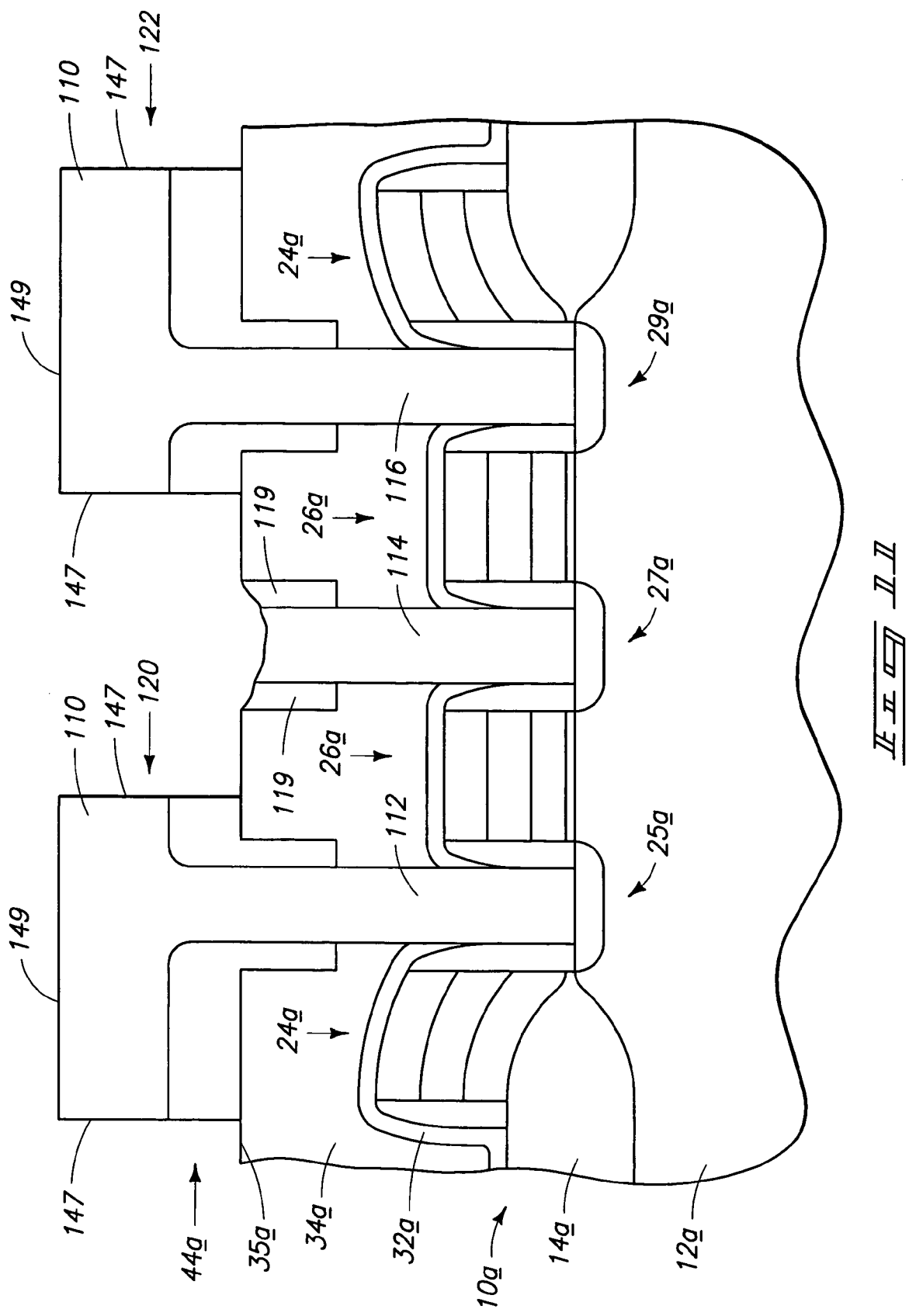
FIG. 11 is a view of the FIG. 2 wafer fragment at a processing step subsequent to that of FIG. 10.

Referring to FIG. 11, storage nodes 120 and 122 comprise top surfaces 149 and, in the shown lateral cross-sectional view, opposing lateral surfaces 147. In preferred embodiments, storage nodes 120 and 122 will comprise a circular or curvaceous horizontal cross-sectional shape, such that the shown lateral surfaces 147 are continuous around the pedestals. However, for purposes of the following discussion the shown lateral surfaces on opposing sides of the pedestals may be referred to as opposing lateral surfaces, as they appear to be opposing surfaces in the cross-sectional views of FIGS. 11–24. Use of the term "opposing lateral surfaces" in either this disclosure or the claims that follow is not to be understood as being limited to embodiments of the pedestals having non-curvaceous horizontal cross-sectional shapes. Defined spacers 119 are formed adjacent pedestal 114 from the etch of layer 44a.

Figure 12:
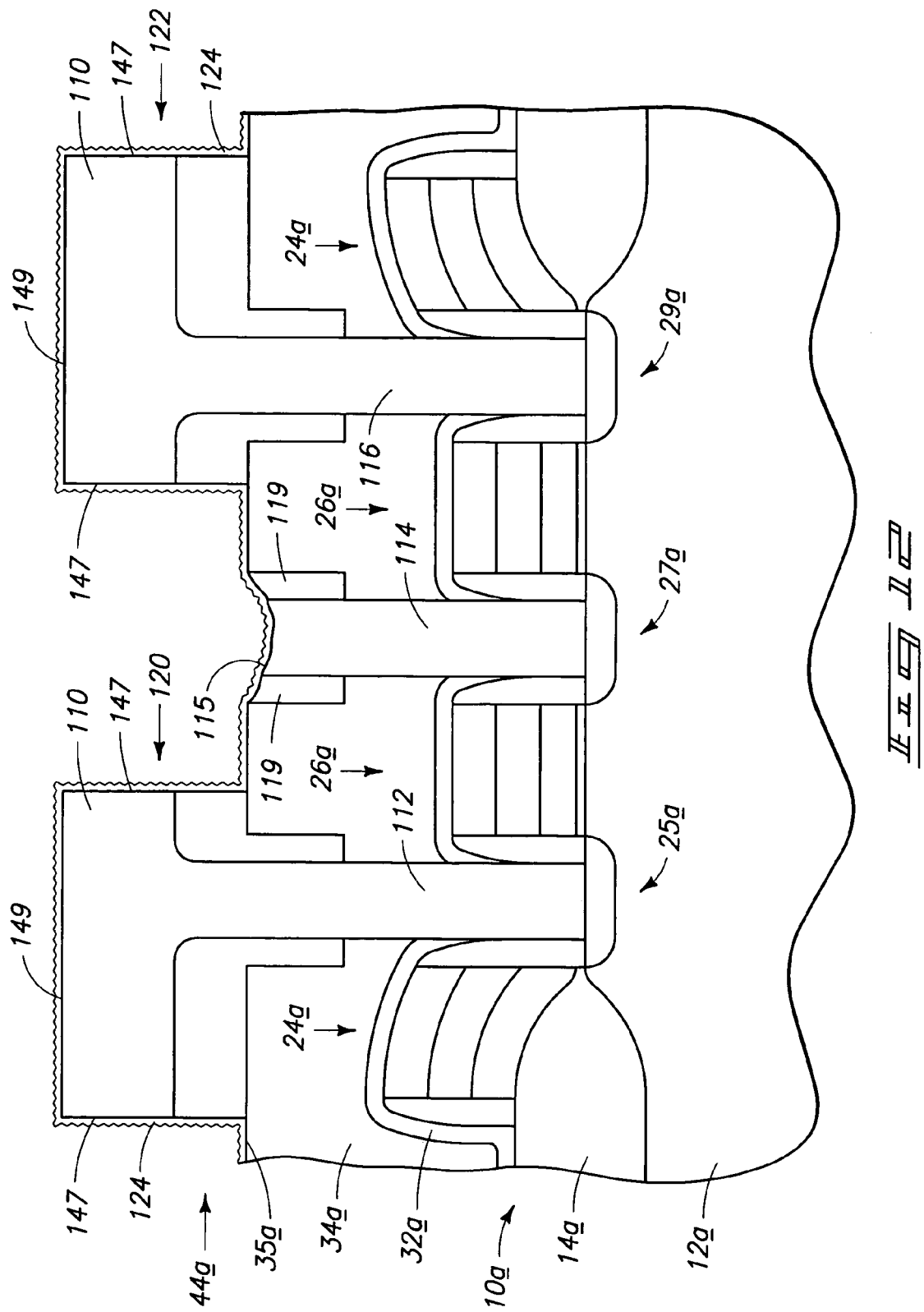
FIG. 12 is a view of the FIG. 2 wafer fragment at a step subsequent to that of FIG. 11.
Figure 13:
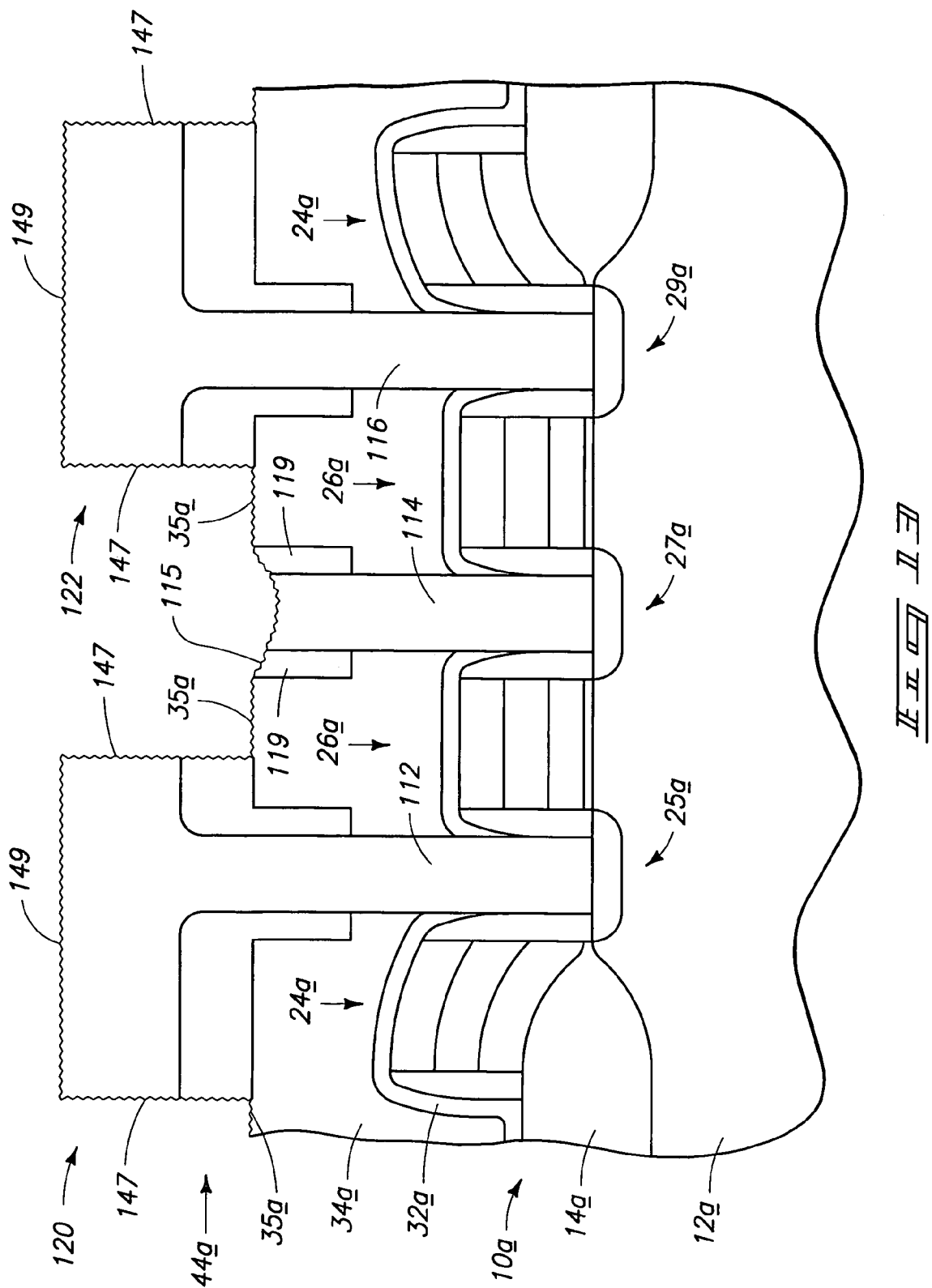
FIG. 13 is a view of the FIG. 2 wafer fragment at a step subsequent to that of FIG. 12.

Referring to FIGS. 12 and 13, outer surfaces 147 and 149 of storage nodes 120 and 122 are preferably effectively roughened. Such roughening can be accomplished by, for example, forming a rugged polysilicon layer 124 over outer surfaces of storage nodes 120 and 122. Preferably, rugged polysilicon layer 124 comprises at least one material selected from the group consisting of cylindrical grain polysilicon and hemispherical grain polysilicon. Roughness is transferred from rugged polysilicon layer 124 to the outer surfaces of nodes 120 and 124 in processing occurring between the illustrated step of FIG. 12 and the illustrated step of FIG. 13. Such transfer of roughness can be accomplished by, for example, an isotropic dry or wet etch of rugged polysilicon layer 124, or an anisotropic dry etch of layer 124. Typically, isotropic etching of rugged polysilicon layer 124 transfers roughness not only to storage nodes 120 and 122, but also to an upper surface 115 of pedestal 114, and to upper surface 35a of BPSG layer 34a. Preferably, the above-described etch of rugged layer 124 ultimately removes rugged layer 124 from over upper surface 35a, and thus advantageously electrically isolates storage nodes 120 and 122 from pedestal 114. In alternative embodiments, which are not shown, outer surfaces 147 and 149 may be roughened by specifically applying a rugged polysilicon layer to these surfaces and not to surface 35a. In such alternative embodiments, the rugged layer need not be etched to isolate nodes 120 and 122 from pedestal 114.

Figure 14:
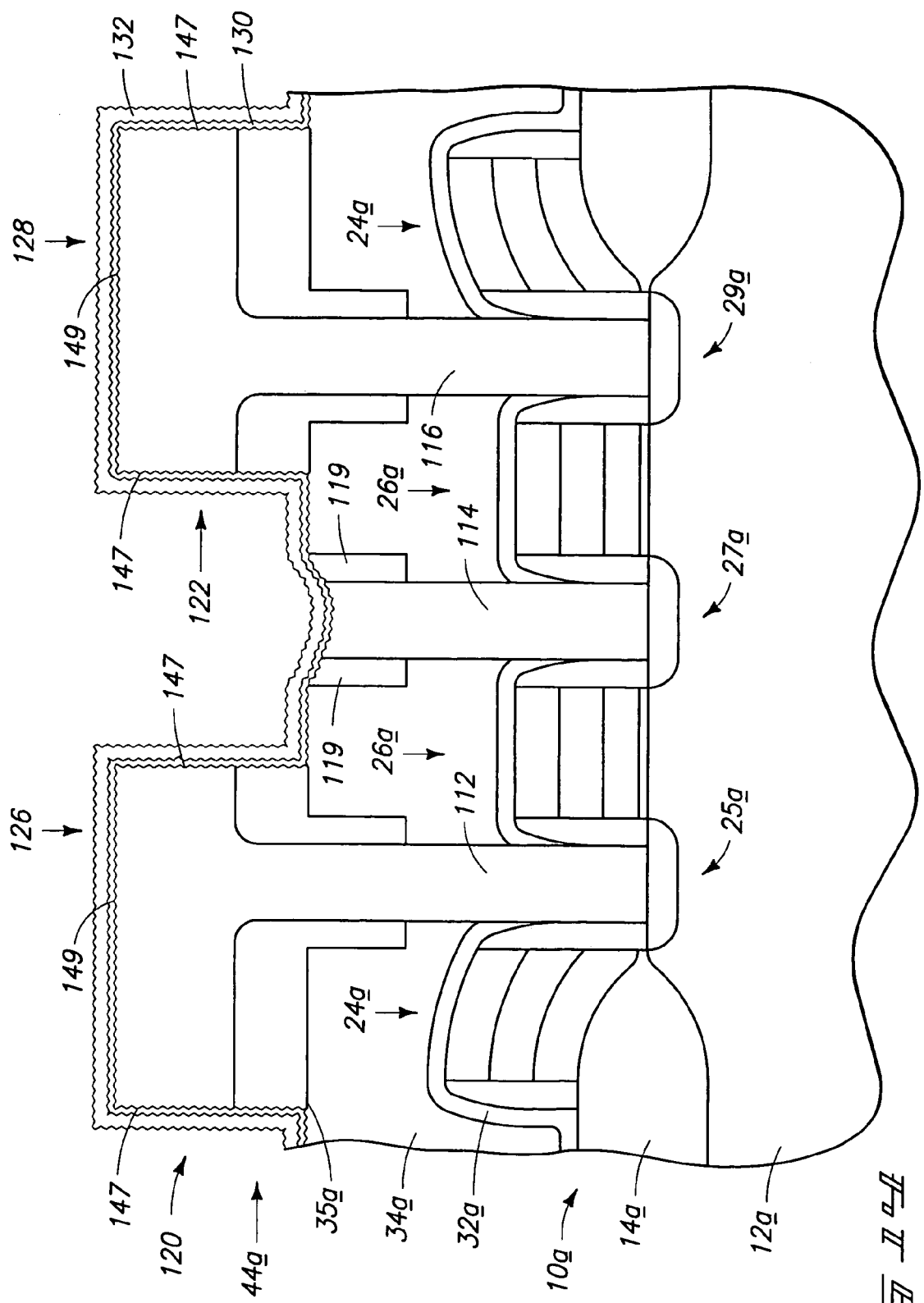
FIG. 14 is a view of the FIG. 2 wafer fragment at a step subsequent to that of FIG. 13.

Referring to FIG. 14, storage nodes 120 and 122 are incorporated into capacitor constructions 126 and 128, respectively. Capacitors 126 and 128 are formed by depositing a dielectric layer 130 and a cell plate layer 132 over surfaces 147 and 149 of nodes 120 and 122. Dielectric layer 130 will typically comprise an insulative material, such as silicon nitride or a composite of silicon oxide and silicon nitride, and cell plate layer 132 will typically comprise a conductive material, such as conductively doped polysilicon.

Figure 15:
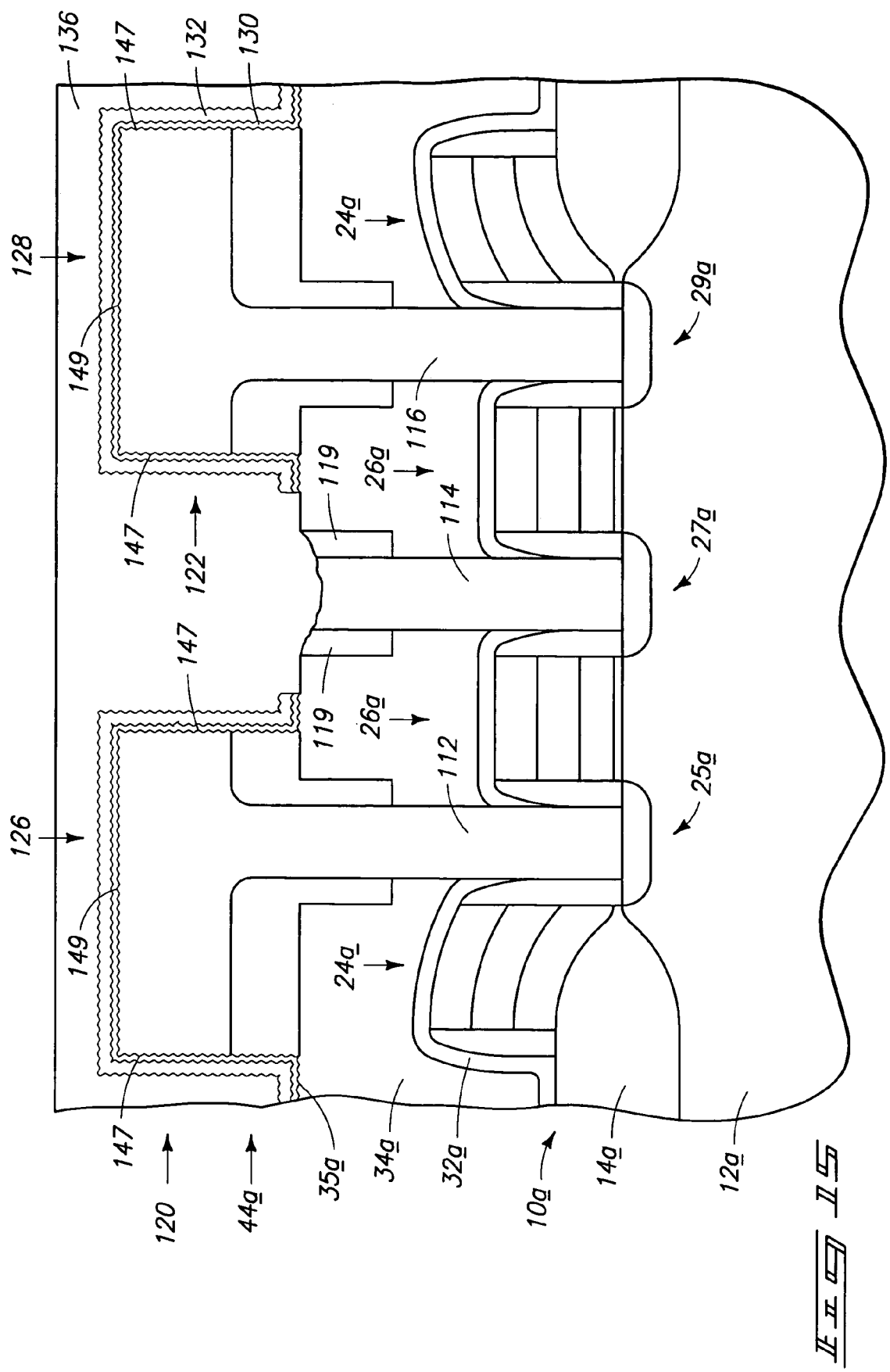
FIG. 15 is a view of the FIG. 2 wafer fragment at a step subsequent to that of FIG. 14.

Referring to FIG. 15, layers 130 and 132 are etched, by conventional methods, to isolate capacitors 126 and 128 from pedestal 114. After the etch of layers 130 and 132, an insulative layer 136 is provided over the capacitor structures 126 and 128, and over pedestal 114. Insulative material 136 may comprise, for example, BPSG.

Figure 16:
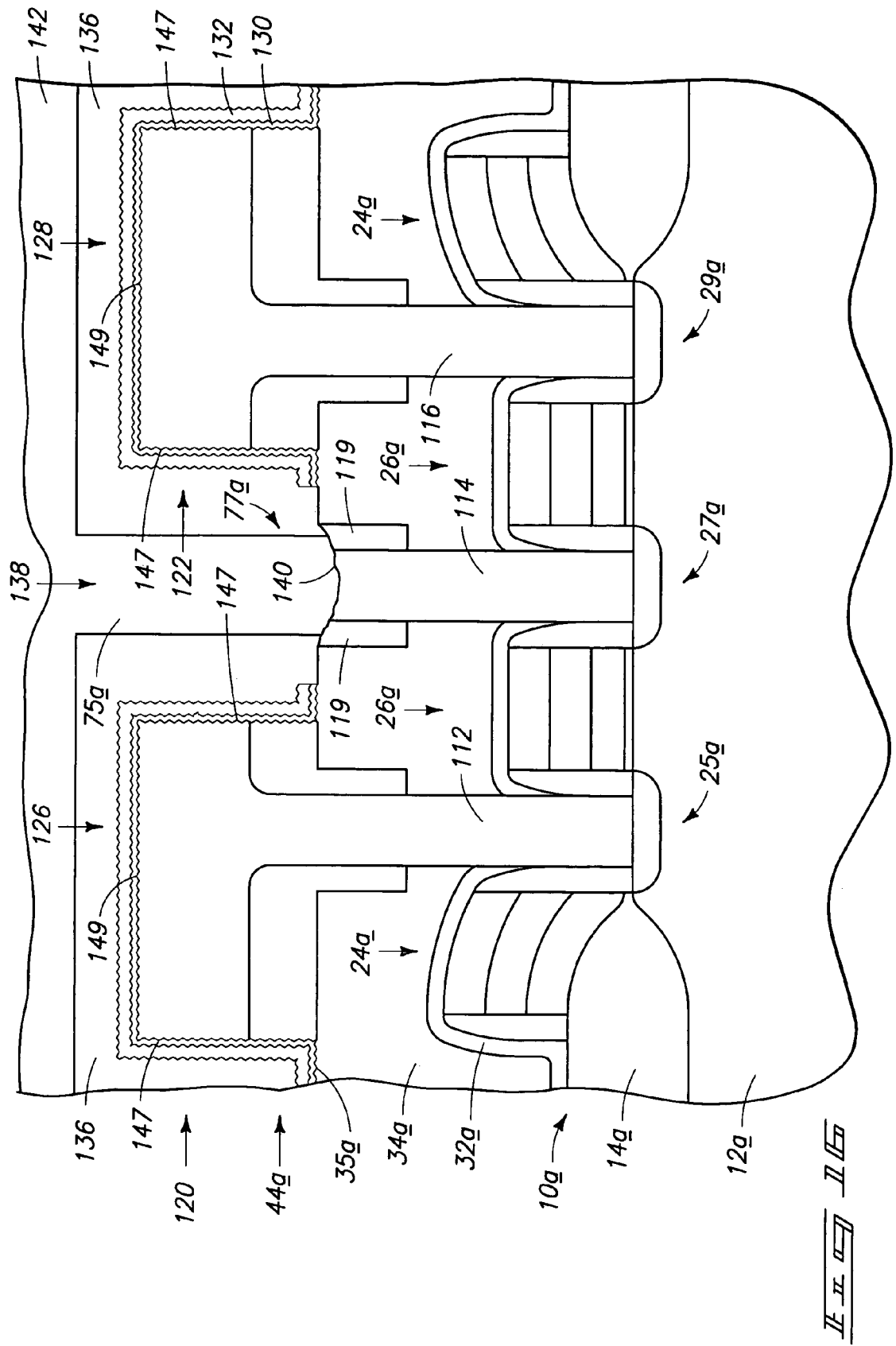
FIG. 16 is a view of the FIG. 2 wafer fragment at a processing step subsequent to that of FIG. 15.

Referring to FIG. 16, a portion of insulative material 136 is removed from over pedestal 114, by conventional methods, to form a bitline plug opening 138. The formation of bitline plug opening 138 exposes an electrically conductive upper surface 140 of pedestal 114.

A conductive layer 142 is formed over layer 136 and within opening 138 to form a bitline plug 75a in electrical connection with pedestal 114. Bitline plug 75a and pedestal 114 together comprise a bitline contact 77a. Conductive layer 142 may comprise, for example, tungsten. Methods for depositing a tungsten layer 142 are know to persons of ordinary skill in the art, and may include, for example, sputter deposition.

Referring to FIG. 17, layer 142 (shown in FIG. 16) is removed from over layer 136. Preferably, such removal is accomplished by polishing, such that a remaining upper surface 144 of layer 136 is planarized. Methods of accomplishing such polishing are known to persons of ordinary skill in the art, and may include, for example, chemical mechanical polishing.

After removal of layer 142 (shown in FIG. 16) from over layer 136, a conductive bitline 76a is provided over layer 136 and in electrical connection with bitline contact 77a. Accordingly, bitline contact 77a electrically connects bitline 76a with node location 27a.

The resulting structure shown in FIG. 17 is a DRAM array comprising capacitors 126 and 128 electrically connected to bitline 76a through transistors of wordlines 26a. Capacitor constructions 126 and 128 comprise polysilicon masking layer 44a against conductively doped polysilicon layer 110. In the shown preferred embodiment, bitline 76a extends above capacitor constructions 126 and 128.

A second embodiment of the invention is described with reference to FIGS. 18 and 19. Referring first to FIG. 18, a wafer fragment 10b is illustrated at a processing step subsequent to the step of FIG. 11. As discussed previously, a preferred embodiment of the invention comprises an undoped polysilicon masking layer 44a (shown and described above with reference to FIG. 8) adjacent a conductively doped polysilicon storage node layer 110. In the embodiment of FIG. 18, the different material constructions of 110 and 44a are utilized to selectively remove layer 44a, and to thereby form, in the lateral cross-sectional view of FIG. 18, laterally opposing cavities 143 beneath storage nodes 120 and 122. As mentioned above, storage nodes 120 and 122 will preferably comprise a circular or curvaceous horizontal cross-sectional shape, such that the shown lateral surfaces 147 are continuous around pedestals 112 and 116. Accordingly, cavities 143 will also preferably extend continuously around pedestals 112 and 116. Cavities 143 increase the available surface area of a capacitor formed from storage nodes 120 and 122.

Etches for selectively removing undoped polysilicon relative to doped polysilicon and oxide are known to persons of ordinary skill in the art. An example of such etching conditions is an etch comprising a tetramethyl ammonium hydroxide (TMAH) solution (2.5% in water), conducted at 30° C. Such etch conditions are selective for undoped polysilicon relative to doped polysilicon, with selectivity commonly being about 40:1 when the doped polysilicon comprises greater than $1\times10^{19}$ ions of dopant/cm$^3$.

After removal of layer 44a, subsequent processing, such as the processing of FIGS. 12–17, may be utilized to form the resultant DRAM array shown in FIG. 19. The DRAM array of FIG. 19 comprises capacitor constructions 148 and 150, with laterally opposing cavities 143 extending beneath storage nodes 120 and 122. As shown, the roughened surfaces of storage nodes 120 and 122, together with dielectric layer 130 and cell plate layer 132 advantageously extend over top surface 149, along the opposing lateral surfaces 147, and within laterally opposing cavities 143.

Figure 20:
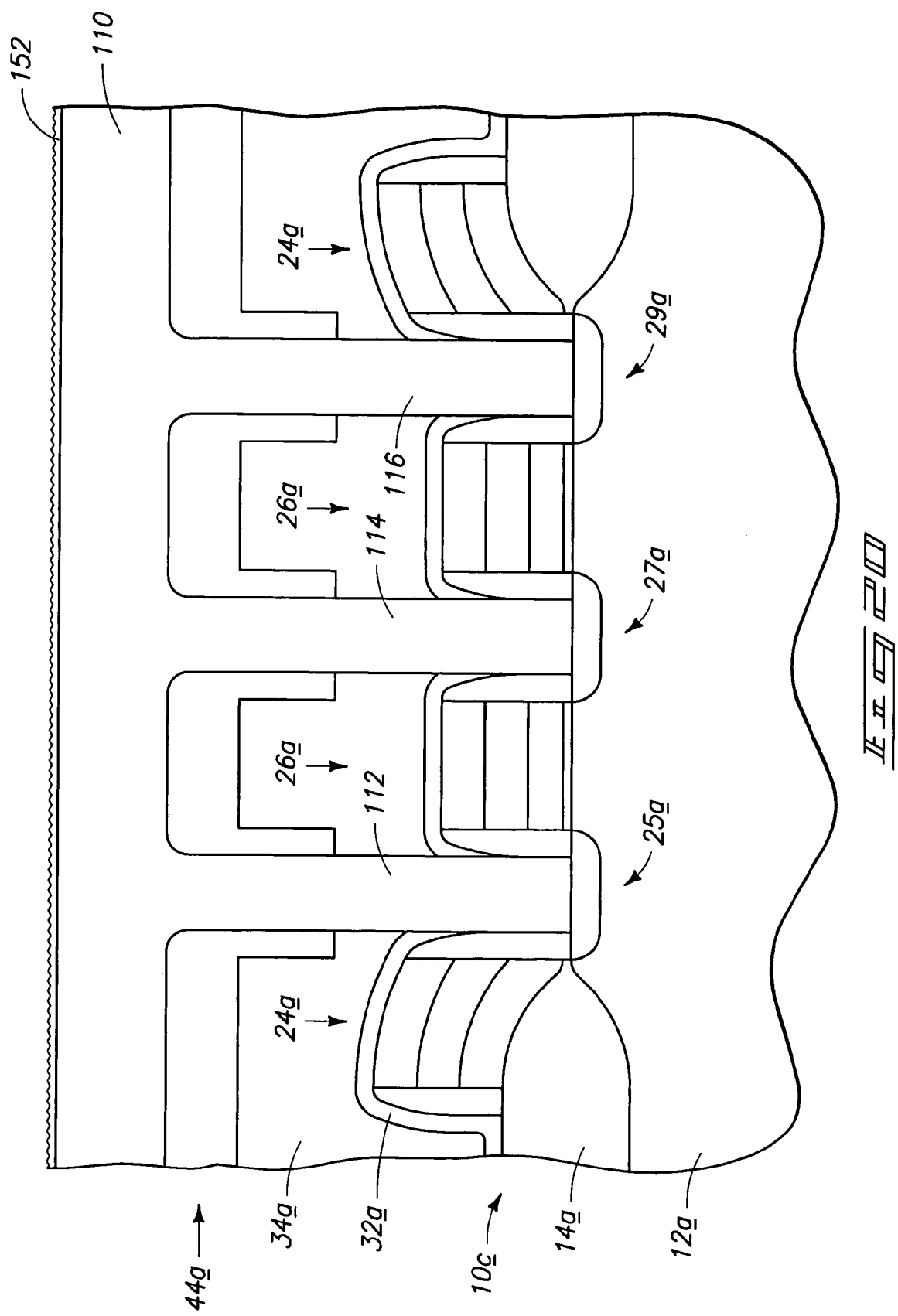
FIG. 20 is a view of the FIG. 2 wafer fragment at a processing step subsequent to that of FIG. 9, processed according to a third embodiment method of the present invention.
Figure 21:
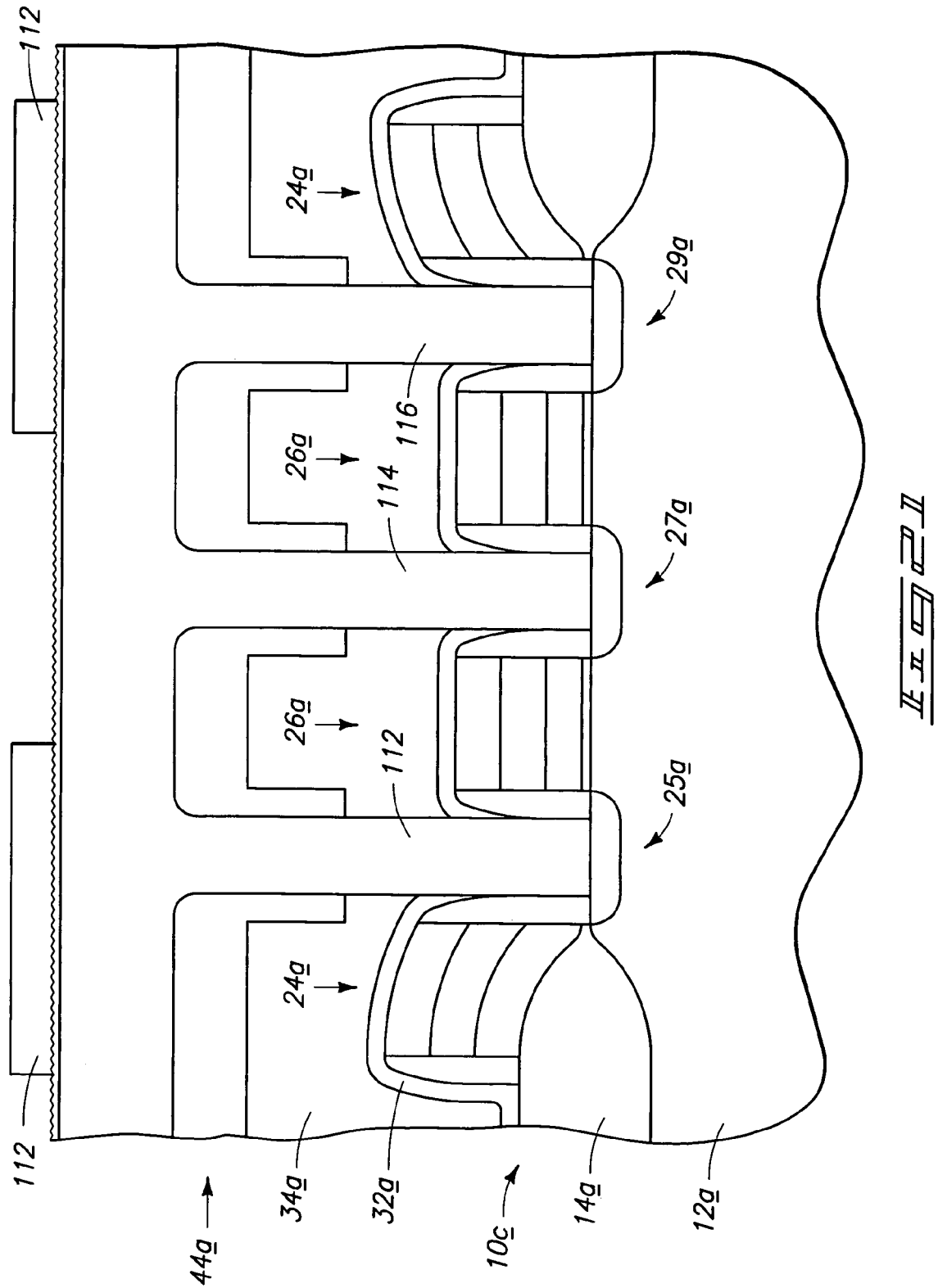
FIG. 21 is a view of the FIG. 2 wafer fragment at a processing step subsequent to that of FIG. 20.

A third embodiment of a method of the present invention is described with reference to FIGS. 20–23. Referring first to FIG. 20, a wafer fragment 10c is illustrated at a step subsequent to that of FIG. 9. Similar to the processing step of FIG. 10, a conductive layer 110 is provided over the fragment 10a of FIG. 20 to form conductive pedestals 112, 114, and 116. However in contrast to the processing step of FIG. 10, a rugged polysilicon layer 152 is provided over layer 110 to roughen an upper surface of layer 110.

After formation of rugged polysilicon layer 152, photoresist blocks 112 are provided over layer 110 and an etch, such as the etch described above with reference to FIGS. 17 and 18, is conducted to form storage node blocks 154 and 156 (shown in FIG. 22) comprising rugged polysilicon layer 152. Like blocks 120 and 122 of FIG. 11, blocks 154 and 156 of FIG. 22 comprise a conductive layer 110, preferably conductively doped polysilicon, adjacent a semiconductive masking layer 44a, preferably comprising undoped polysilicon.

Figure 22:
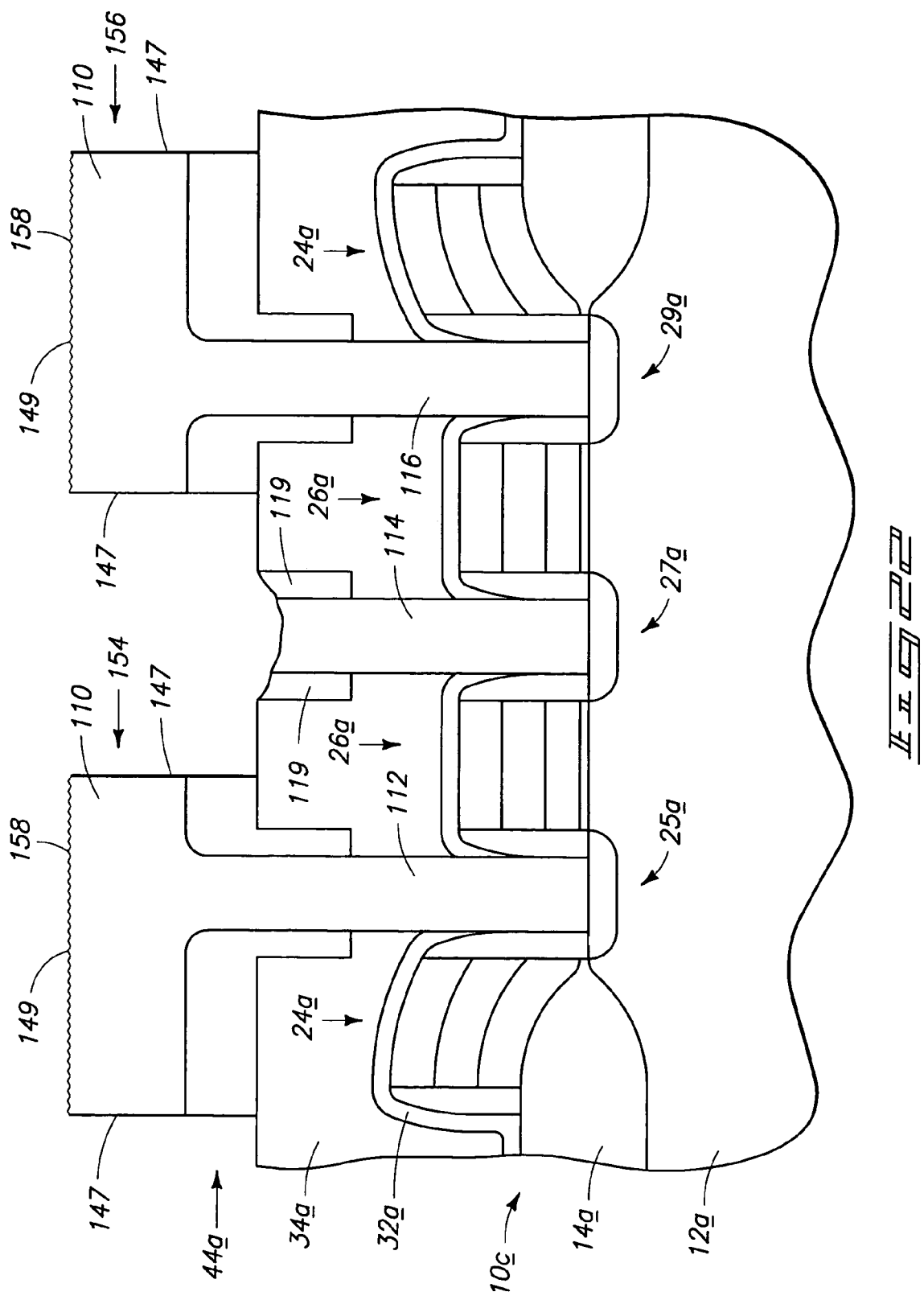
FIG. 22 is a view of the FIG. 2 wafer fragment at a processing step subsequent to that of FIG. 21.
Figure 23:
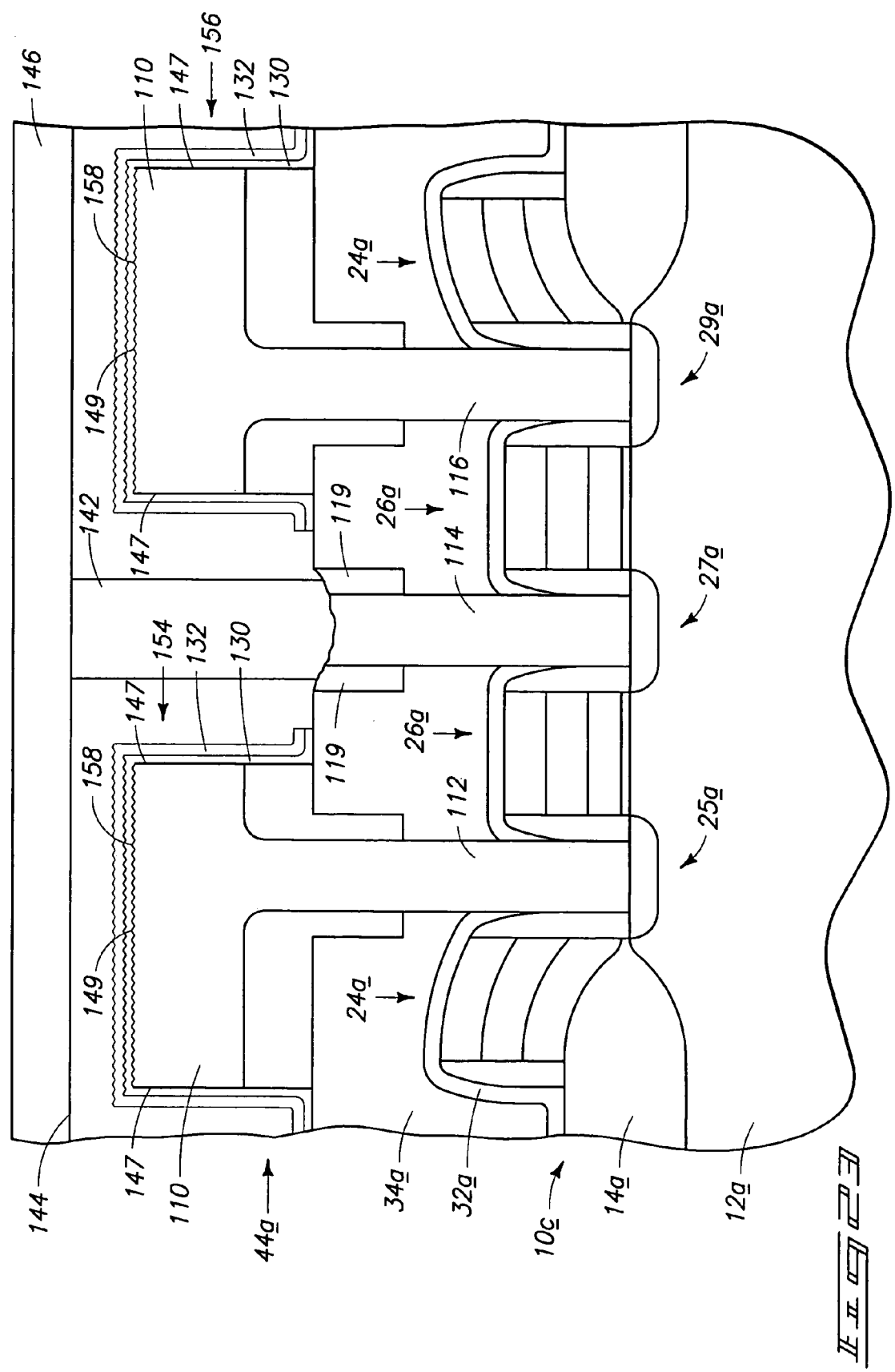
FIG. 23 is a view of the FIG. 2 wafer fragment at a processing step subsequent to that of FIG. 22.

Wafer 10c of FIG. 22 may be subjected to subsequent processing, such as that described above with reference to FIGS. 14–17, to form the DRAM array of FIG. 23.

In a fourth embodiment of the invention, the second and third embodiments (i.e. the embodiments of FIGS. 20–23, and of FIGS. 18–19) are combined to form the shown wafer fragment 10d of FIG. 24. Wafer fragment 10d comprises a DRAM array, with gaps 143 adjacent storage nodes 154 and 156. In the shown preferred aspect of the embodiment, dielectric layer 130 and cell plate layer 132 envelop within gaps 143.

The above-described DRAMs and capacitors of the present invention can be implemented into integrated circuitry, including microprocessors.

To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor construction, comprising:
    an insulative layer over a semiconductive substrate and having an uppermost surface, an opening extending at least partially into the insulative layer; a periphery of the opening comprising sidewalls of the insulative layer, the sidewalls intersecting the uppermost surface to define corners;
    a conductive masking layer over portions of the sidewalls and narrowing a lateral width of the opening; the conductive masking layer extending from the sidewalls, over the corners, and over a portion of the uppermost surface of the insulative layer;
    a storage electrode layer against the conductive masking layer and extending at least partially into the opening;
    a dielectric layer proximate the storage electrode layer; and
    a cell electrode layer proximate the dielectric layer.

2. The semiconductor construction of claim 1 wherein the storage electrode layer comprises doped polysilicon and wherein the conductive masking layer comprises doped polysilicon.

3. The semiconductor construction of claim 1 wherein the storage electrode layer comprises a roughened silicon-containing upper surface.

4. The semiconductor construction of claim 1 wherein the conductive masking layer comprises a single layer.

* * * * *

UNITED STATES PATENT AND TRADEMARK OFFICE
CERTIFICATE OF CORRECTION

PATENT NO. : 7,151,291 B2
APPLICATION NO. : 11/074107
DATED : December 19, 2006
INVENTOR(S) : Parekh et al.

Page 1 of 1

It is certified that error appears in the above-identified patent and that said Letters Patent is hereby corrected as shown below:

Col. 2, line 6, please delete "borophbosilicate" after "A" and insert --borophosphosilicate--.

Col. 2, line 36, please delete "wordline a" before "26" and insert --wordline--.

Col. 4, line 54, please delete "a" after "26*a*,".

Col. 4, line 58, please delete "11" after "alternative".

Col. 7, line 38, please delete "know" after "are" and insert --known--.

Signed and Sealed this

Twenty-third Day of October, 2007

JON W. DUDAS
*Director of the United States Patent and Trademark Office*